(12) United States Patent
Hayashi et al.

(10) Patent No.: US 7,488,895 B2
(45) Date of Patent: Feb. 10, 2009

(54) METHOD FOR MANUFACTURING COMPONENT BUILT-IN MODULE, AND COMPONENT BUILT-IN MODULE

(75) Inventors: Yoshitake Hayashi, Kadoma (JP); Masayoshi Koyama, Kadoma (JP); Satoru Yuhaku, Kadoma (JP); Kazuo Otani, Kadoma (JP); Susumu Matsuoka, Kadoma (JP); Yasushi Taniguchi, Kadoma (JP); Seiichi Nakatani, Kadoma (JP)

(73) Assignee: Panasonic Corporation, Osaka (JP)

( * ) Notice: Subject to any disclaimer, the term of this patent is extended or adjusted under 35 U.S.C. 154(b) by 177 days.

(21) Appl. No.: 10/573,717

(22) PCT Filed: Sep. 27, 2004

(86) PCT No.: PCT/JP2004/014546

§ 371 (c)(1),
(2), (4) Date: Mar. 28, 2006

(87) PCT Pub. No.: WO2005/039262

PCT Pub. Date: Apr. 28, 2005

(65) Prior Publication Data

US 2007/0119617 A1    May 31, 2007

(30) Foreign Application Priority Data

Sep. 29, 2003   (JP)   ............... 2003-337992
Dec. 1, 2003    (JP)   ............... 2003-402060

(51) Int. Cl.
*H05K 1/03*    (2006.01)

(52) U.S. Cl. ............... 174/255; 174/253; 174/256; 174/258; 174/259; 174/260; 174/262; 174/264; 361/760; 361/761; 361/762; 29/852

(58) Field of Classification Search ............... 174/255, 174/253, 256, 258–260, 262, 264; 361/760–762; 29/852

See application file for complete search history.

(56) References Cited

U.S. PATENT DOCUMENTS

| 6,038,133 | A  |   | 3/2000 | Nakatani et al. |
| 6,732,428 | B1 | * | 5/2004 | Kwong ............ 29/832 |
| 6,774,316 | B1 | * | 8/2004 | Suzuki et al. .......... 174/262 |
| 6,931,725 | B2 | * | 8/2005 | Sugaya et al. .......... 29/852 |

(Continued)

FOREIGN PATENT DOCUMENTS

EP    1 351 301    10/2003

(Continued)

*Primary Examiner*—Dean A. Reichard
*Assistant Examiner*—Xiaoliang Chen
(74) *Attorney, Agent, or Firm*—Hamre, Schumann, Mueller & Larson, P.C.

(57) ABSTRACT

A component built-in module of the present invention includes: a first wiring pattern; an electronic component mounted on the first wiring pattern; a second wiring pattern; an electrical insulating sheet with the electrical component built therein, the electrical insulating sheet being disposed between the first wiring pattern and the second wiring pattern; and a via conductor formed in a via hole penetrating through the electrical insulating sheet, the via conductor connecting electrically the first wiring pattern and the second wiring pattern. A side face of the via conductor defines a continuous line in an axis direction of the via conductor. Thus, a component built-in module having excellent reliability concerning electrical connection can be provided.

20 Claims, 18 Drawing Sheets

U.S. PATENT DOCUMENTS

| | | | |
|---|---|---|---|
| 7,022,276 B2* | 4/2006 | Hirano et al. | 264/156 |
| 7,068,519 B2* | 6/2006 | Nakatani et al. | 361/762 |
| 2004/0041243 A1* | 3/2004 | Ogawa | 257/668 |
| 2004/0078969 A1* | 4/2004 | Kanzawa et al. | 29/852 |
| 2005/0124197 A1* | 6/2005 | Okimoto et al. | 439/326 |

FOREIGN PATENT DOCUMENTS

| | | |
|---|---|---|
| JP | 61-288498 | 12/1986 |
| JP | 6-32378 | 4/1994 |
| JP | 11-177199 | 7/1999 |
| JP | 11-220262 | 8/1999 |
| JP | 2002-103561 | 4/2002 |
| JP | 2003-133743 | 5/2003 |
| JP | 2003-188308 | 7/2003 |
| JP | 2003-243835 | 8/2003 |

* cited by examiner

METHOD FOR MANUFACTURING COMPONENT BUILT-IN MODULE, AND COMPONENT BUILT-IN MODULE

TECHNICAL FIELD

The present invention relates to a method for manufacturing a component built-in module and a component built-in module.

BACKGROUND ART

In recent years, along with demands for smaller electronic equipment having advanced performance, a wiring board for use with electronic equipment has been demanded so as to allow for high-density mounting of electronic components and miniaturization. To achieve such demands, electronic components in a thin film form are incorporated in a wiring board for realizing high-density mounting, or three-dimensional mounting technology has been developed so that existing electronic components of semiconductors and capacitors can be built therein (see JP H06(1994)-32378 B2, for example).

One proposed example is a component built-in module, in which active components such as semiconductors and passive components such as capacitors are embedded in a composite sheet including inorganic filler and thermosetting resin.

Since this component built-in module contains a large amount of fine particles of inorganic filler, it has an excellent heat-radiation property and a low dielectric constant while allowing electronic components to be embedded therein easily. Thereby, the component built-in module allows its wiring to be shortened while having a shielding effect and so has a high noise immunity. Therefore such a component built-in module is effective as a wiring board operating at high frequencies, in which components are three-dimensionally mounted with high density.

As means for establishing continuity between upper and lower wiring patterns in the above component built-in module, a via hole may be formed in a composite sheet and this via hole may be filled with a conductive resin paste. Such a method for manufacturing a component built-in module is proposed in JP H11(1999)-220262 A, for example.

The following describes an example of a specific method for manufacturing a component built-in module, with reference to FIGS. 20 to 22. Firstly, as shown in FIG. 20A, protective films 1002a and 1002b are attached to both faces of an uncured composite sheet 1001 so as to form a sheet member 1003 of about 100 μm in thickness.

Then, as shown in FIG. 20B, a cavity 1004 corresponding to the shape of an electronic component 1301 (see FIG. 22A) to be built therein is formed in the sheet member 1003 by laser processing or punching. Next, as shown in FIG. 20C, the protective film 1002b on one side is peeled off, and a new protective film 1002c is attached thereto instead so as to cover the opening of the cavity 1004.

Then, as shown in FIG. 20D, a via hole 1005 is formed by laser processing or punching so as to penetrate through the sheet member 1003. Subsequently, as shown in FIG. 20E, the via hole 1005 is filled with a conductive resin paste 1006 by printing or the like. Then, as shown in FIG. 20F, the protective films 1002a and 1002c are peeled off so as to form a sheet member 1100.

On the other hand, as shown in FIGS. 21A to D, a sheet member 1200 is prepared by the process similar to the above for the sheet member 1100 except that no cavities are formed. The sheet member 1200 functions so as to prevent the interference between the built-in electronic component 1301 (see FIG. 22A) and a second wiring board 1400 (see FIG. 22A).

Then, as shown in FIG. 22A, the two sheet members 1100, the sheet member 1200, a first wiring board 1300 including a first wiring pattern 1302 and an electronic component 1301 mounted on the first wiring pattern 1302 and a second wiring board 1400 including a second wiring pattern 1401 are aligned with each other and stacked, followed by hot pressing, whereby the first wiring pattern 1302 and the second wiring pattern 1401 are connected electrically through via conductors 1501, 1502 and 1503 (see FIG. 22B for all) made of the conductive resin paste 1006. In this way, the component built-in module 1500 as shown in FIG. 22B can be manufactured.

According to the above-stated conventional manufacturing method, however, since at least two sheet members are stacked, misalignment might occur during stacking of the respective sheet members. If misalignment occurs among the respective sheet members during stacking, misalignment may occur as shown in FIG. 22B between a side face 1501a of the via conductor 1501 and a side face 1502a of the via conductor 1502 and between the side face 1502a of the via conductor 1502 and a side face 1503a of the via conductor 1503, and such misalignment may lead to the degradation in reliability for electrical connection.

DISCLOSURE OF INVENTION

In view of such circumstances, it is an object of the present invention to provide a method for manufacturing a component built-in module having excellent reliability concerning electrical connection and such a component built-in module.

A method for manufacturing a component built-in module of the present invention includes the steps of:

on one principal surface of a first electrical insulating sheet with a cavity formed penetrating therethrough, laminating a second electrical insulating sheet so as to cover the cavity, so that a third electrical insulating sheet including the first electrical insulating sheet and the second electrical insulating sheet is formed;

forming a via hole so as to penetrate through the third electrical insulating sheet;

filling the via hole with a conductive resin paste;

disposing a first wiring board with a first wiring pattern and an electronic component mounted on the first wiring pattern so as to face a principal surface of the third electrical insulating sheet at which the cavity has been formed, and disposing a second wiring board with a second wiring pattern so as to be opposed to the first wiring board with respect to the third electrical insulating sheet;

stacking the first wiring board, the third electrical insulating sheet and the second wiring board so that the electronic component is built in the cavity and the via hole is disposed between the first wiring pattern and the second wiring pattern; and applying heat and pressure by hot pressing to the stacked first wiring board, third electrical insulating sheet and second wiring board, so that the first wiring pattern and the second wiring pattern are connected electrically through a via conductor made of the conductive resin paste.

A component built-in module of the present invention includes:

a first wiring pattern;

an electronic component mounted on the first wiring pattern;

a second wiring pattern;

an electrical insulating sheet with the electrical component built therein, the electrical insulating sheet being disposed between the first wiring pattern and the second wiring pattern; and a via conductor formed in a via hole penetrating through the electrical insulating sheet, the via conductor connecting electrically the first wiring pattern and the second wiring pattern.

In this component built-in module, a side face of the via conductor defines a continuous line in an axis direction of the via conductor.

DESCRIPTION OF THE INVENTION

Figure 1:
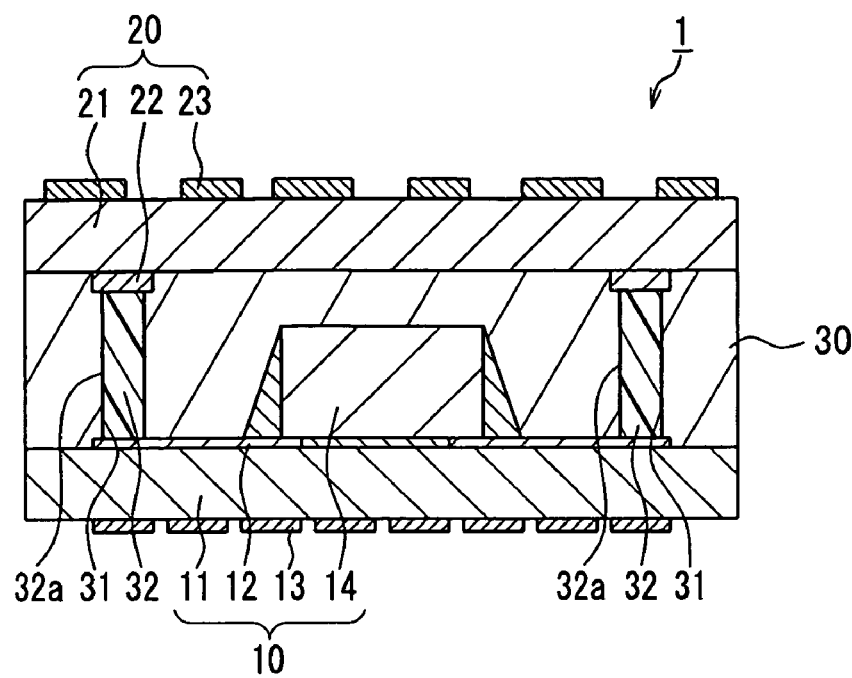
FIG. 1 is a cross-sectional view of a component built-in module according to Embodiment 1 of the present invention.

According to the method for manufacturing a component built-in module of the present invention, firstly, on one principal surface of a first electrical insulating sheet with a cavity formed penetrating therethrough, a second electrical insulating sheet is laminated so as to cover the cavity, so that a third electrical insulating sheet including the first electrical insulating sheet and the second electrical insulating sheet is formed. The second electrical insulating sheet functions so as to prevent the interference between the electronic component to be built therein and the second wiring board described later. The cavity may be formed corresponding to the size of the electronic component to be built therein, and for example the capacity of the cavity may be about 80 to 120% of the volume of the electronic component to be built therein. The cavity may be manufactured by punching, laser processing or the like.

Preferably, the first and the second electrical insulating sheets include 70 to 95 weight % of inorganic filler and 5 to 30 weight % of uncured thermosetting resin composition, and have a flow viscosity at 120° C. from 1,000 to 20,000 Pa·S. When the amount of inorganic filler is less than 70 weight % or a flow viscosity is less than 1,000 Pa·S, the viscosity of the first and the second electrical insulating sheets might decrease rapidly during the hot pressing described later, thus increasing fluidity. In such a case, the conductive resin paste in the via hole formed in the first and the second electrical insulating sheets would flow, so that the via conductor formed might be deformed. On the other hand, when the amount of inorganic filler exceeds 95 weight % and a flow viscosity exceeds 20,000 Pa·S, the viscosity of the first and the second electrical insulating sheets is too large, thus degrading the formability. As the above-stated inorganic filler, $Al_2O_3$, MgO, BN, AlN, $SiO_2$ and the like may be used, and as the above-stated thermosetting resin composition, a composition containing epoxy resin, phenol resin, cyanate resin and the like as a main component may be used. The thicknesses of the first and the second electrical insulating sheets may be 50 to 600 μm and 50 to 100 μm, respectively.

When the second electrical insulating sheet is laminated on the first electrical insulating sheet, the lamination may be conducted using a vacuum lamination device, for example. The lamination conditions therefor preferably are at a temperature of 100° C. or lower and at a pressure of 1 MPa or lower. When the lamination is conducted at a temperature exceeding 100° C., the curing of the first and the second electrical insulating sheets will proceed rapidly, so that the adhesiveness with the wiring board might be degraded during the hot pressing described later. When the lamination is conducted at a pressure exceeding 1 MPa, the cavity formed in the first electrical insulating sheet might be deformed. Note here that in order to keep the favorable adhesiveness between the first electrical insulating sheet and the second electrical insulating sheet, the lamination preferably is conducted at a temperature of 30° C. or higher and at a pressure of 0.05 MPa or higher.

Next, a via hole may be formed so as to penetrate through the third electrical insulating sheet by punching, laser processing or the like. The diameter of the via hole may be 50 to 200 μm, for example.

Subsequently, the via hole is filled with a conductive resin paste by printing or the like. The conductive resin paste used may include conductive powder containing silver, copper, gold, nickel or the like and a thermosetting resin such as epoxy resin, for example.

Next, a first wiring board with a first wiring pattern and an electronic component mounted on the first wiring pattern may be disposed so as to face a principal surface of the third electrical insulating sheet at which the cavity has been formed, and a second wiring board with a second wiring pattern may be disposed so as to be opposed to the first wiring board with respect to the third electrical insulating sheet. Then, the first wiring board, the third electrical insulating sheet and the second wiring board may be aligned and stacked so that the electronic component is built in the cavity and the via hole is disposed between the first wiring pattern and the second wiring pattern.

As bases of the first and the second wiring boards, an electrical insulating base such as a glass epoxy base may be used. The first and the second wiring patterns may be formed by a well-known method, and for example, they may be obtained by patterning metal foil such as copper foil, which is bonded to the electrical insulating base by hot pressing, using photolithography technology. At this time, the height and the pitch of the wiring may be 5 to 30 μm and 20 to 200 μm, respectively. As the electronic component, active components such as semiconductors and passive components such as capacitors may be used.

Subsequently, heat and pressure may be applied by hot pressing to the stacked first wiring board, third electrical insulating sheet and second wiring board. Thereby, the first wiring pattern and the second wiring pattern are connected electrically through a via conductor made of the conductive resin paste, and a component built-in module can be obtained.

In this way, according to the method for manufacturing a component built-in module of the present invention, after the second electrical insulating sheet is laminated on the first electrical insulating sheet with a cavity formed penetrating therethrough, which is for preventing the interference between the electronic component to be built therein and the second wiring board, a via hole is formed penetrating through them. Therefore, misalignment of the via conductor as described in the conventional technology does not occur. Thus, a component built-in module having excellent reliability concerning electrical connection can be provided.

Further, in the method for manufacturing a component built-in module of the present invention, the third electrical insulating sheet may be formed by further laminating a fourth electrical insulating sheet with a cavity formed penetrating therethrough so as to be opposed to the first electrical insulating sheet with respect to the second electrical insulating sheet. The second wiring board disposed to be opposed to the first wiring board further may include an electronic component mounted on the second wiring pattern. The first wiring board, the third electrical insulating sheet and the second wiring board may be stacked so that the electronic component mounted on the second wiring pattern is built in the cavity formed in the fourth electrical insulating sheet. This allows a plurality of electronic components to be disposed three-dimensionally in the third electrical insulating sheet. The fourth electrical insulating sheet may be made of a material similar to that of the first and the second electrical insulating sheets.

Further, in the method for manufacturing a component built-in module of the present invention, the second electrical insulating sheet may include a cavity penetrating therethrough, the cavity being formed at a position that does not overlap with a position of the cavity formed in the first electrical insulating sheet. The second wiring board disposed to be opposed to the first wiring board further may include an electronic component mounted on the second wiring pattern. The first wiring board, the third electrical insulating sheet and the second wiring board may be stacked so that the electronic component mounted on the second wiring pattern is built in the cavity formed in the second electrical insulating sheet. This allows a plurality of electronic components to be disposed three-dimensionally in the third electrical insulating sheet, and moreover an electrical insulating sheet for preventing the interference between electronic components is not required, so that the third electrical insulating sheet can be made thinner.

Further, in the method for manufacturing a component built-in module of the present invention, the first wiring board further may include a supporting member with the first wiring pattern formed thereon, and after applying heat and pressure by the hot pressing, the supporting member may be removed by peeling, etching or the like. Thereby, the component built-in module can be manufactured without disposing an electrical insulating base on the principal surface of the third electrical insulating sheet at which the first wiring pattern is embedded. Therefore, the component built-in module as a whole can have a low profile. As the above-stated supporting member, copper foil, aluminum board, plastic film and the like can be used. The thickness of the supporting member may be from 30 to 200 μm, for example.

Further, in the method for manufacturing a component built-in module of the present invention, the cavity formed in the first electrical insulating sheet may include a first cavity and a second cavity. The second electrical insulating sheet may include a third cavity communicating with the second cavity. The electronic component mounted on the first wiring pattern of the first wiring board may include a first electronic component and a second electronic component whose height is larger than that of the first electronic component. The first wiring board, the third electrical insulating sheet and the second wiring board may be stacked so that the first electronic component is built in the first cavity and the second electronic component is built in the second cavity and the third cavity. Thereby, even when a plurality of electronic components having different heights are to be built therein, the cavities can be formed corresponding to the respective heights of the electronic components. Therefore, at the hot pressing process, for example, excessive flowing of the resin into the cavities can be suppressed.

Further, in the method for manufacturing a component built-in module of the present invention, after attaching a protective film to a principal surface of the third electrical insulating sheet, the via hole may be formed so as to penetrate through the protective film and the third electrical insulating sheet. This can prevent the adhesion of the conductive resin paste to the principal surface of the third electrical insulating sheet. As the protective film, a film made of polyethylene terephthalate, polypropylene, polyphenylene sulfide, polyethylene naphthalate or the like and of about 10 to 100 μm in thickness can be used. Further, in the above-stated manufacturing method, if the via hole is formed by punching, for example, a protective film whose rupture elongation is 110% or less facilitates the formation of the via hole.

Further, in the method for manufacturing a component built-in module of the present invention, the via hole may be filled with the conductive resin paste by the steps of: (i) disposing the conductive resin paste on a principal surface of the third electrical insulating sheet; (ii) applying the conductive resin paste over the principal surface so that a paste layer made of the conductive resin paste with a predetermined thickness is formed around an opening of the via hole on the principal surface, while filling the via hole with the conductive resin paste; and (iii) scraping the paste layer off from the principal surface, while filling the via hole with the conductive resin paste (hereinafter called the above (i) to (iii) a first filling method). In the case where an aspect ratio of the via hole, i.e., the value obtained by dividing the depth of the via hole by the diameter thereof, is large, the filling operation of the conductive resin paste may be divided and conducted plural times. In such a case, bubbles may tend to enter between the conductive resin paste charged during the first filling operation and the conductive resin paste charged during the second filling operation, resulting in an increase in electrical resistance of the via conductor formed. On the other hand, according to the above-stated first filling method, even when the filling operation of the conductive resin paste is divided and conducted plural times, it can be filled while preventing the bubbles from entering into the via hole.

Further, in the method for manufacturing a component built-in module of the present invention, in the case where after attaching a protective film to a principal surface of the third electrical insulating sheet, the via hole is formed so as to penetrate through the protective film and the third electrical insulating sheet, the via hole may be filled with the conductive resin paste by the steps of: (i) disposing the conductive resin paste on a principal surface of the protective film; (ii) applying the conductive resin paste over the principal surface of the protective film so that a paste layer made of the conductive resin paste with a predetermined thickness is formed around an opening of the via hole on the principal surface of the protective film, while filling the via hole with the conductive resin paste; and (iii) scraping the paste layer off from the principal surface of the protective film, while filling the via hole with the conductive resin paste (hereinafter a second filing-method). This can prevent the adhesion of the conductive resin paste to the principal surface of the third electrical insulating sheet, and moreover even when the filling operation of the conductive resin paste is divided and conducted plural times, it can be filled while preventing the bubbles from entering into the via hole.

Further, when the via hole is filled with the conductive resin paste using the first or the second filling method, it is preferable that the paste layer is formed on the opening of the via hole and at a region within at least 300 µm from an edge of the opening. This can prevent bubbles from entering into the via hole with reliability.

Further, when the via hole is filled with the conductive resin paste using the first or the second filling method, it is preferable that the predetermined thickness of the paste layer is from 10 to 100 µm. When the predetermined thickness is less than 10 µm, it might be difficult to prevent bubbles from entering into the via hole in some filling conditions. On the other hand, if the predetermined thickness exceeds 100 µm, when the above (i) and (iii) are conducted using a squeegee, for example, the charging pressure by the squeegee to the paste layer will become small, thus making it difficult to fill with the conductive resin paste. Note here that the predetermined thickness refers to the average thickness of the paste layer.

Further, when the via hole is filled with the conductive resin paste using the first or the second filling method, before conducting the step (iii) or during the step (iii), a part of a resin component of the conductive resin paste charged in the via hole may be sucked through an opposite opening of the via hole. This can increase the density of the conductive powder in the conductive resin paste charged in the via hole, thus reducing the electrical resistance of the via conductor formed. The above suction may be performed using a vacuum pump, for example, and at the ultimate pressure of about 1 to $1 \times 10^4$ Pa.

The above first and second filling methods are effective especially for the case where the aspect ratio of the via hole is 1 or more and the diameter of the via hole is 200 µm or less. Further, in the above first and second filling methods, after conducting the step (ii) plural times, the step (iii) may be conducted.

A component built-in module of the present invention includes: a first wiring pattern; an electronic component mounted on the first wiring pattern; a second wiring pattern; an electrical insulating sheet with the electrical component built therein, the electrical insulating sheet being disposed between the first wiring pattern and the second wiring pattern; and a via conductor formed in a via hole penetrating through the electrical insulating sheet, the via conductor connecting electrically the first wiring pattern and the second wiring pattern. In this component built-in module, a side face of the via conductor defines a continuous line in an axis direction of the via conductor. Thereby, a component built-in module having excellent reliability concerning electrical connection can be provided. Note here that the above-stated elements of the component built-in module of the present invention may be the same elements as used in the above-stated method for manufacturing a component built-in module of the present invention. Further, the component built-in module of the present invention can be manufactured by the above-stated method for manufacturing a component built-in module of the present invention.

The following describes embodiments of the present invention, with reference to the drawings.

EMBODIMENT 1

Firstly, a component built-in module according to Embodiment 1 of the present invention is described below. FIG. 1 referred to herein is a cross-sectional view of the component built-in module according to Embodiment 1.

As shown in FIG. 1, a component built-in module 1 includes a first wiring board 10, a second wiring board 20 and an electrical insulating sheet 30 disposed between the first wiring board 10 and the second wiring board 20.

The first wiring board 10 includes an electrical insulating base 11, a first wiring pattern 12 formed on the electrical insulating base 11 so as to face the electrical insulating sheet 30, a surface layer wiring pattern 13 formed on the electrical insulating base 11 so as to be opposed to the first wiring pattern 12 with respect to the electrical insulating base 11, and an electronic component 14 mounted on the first wiring pattern 12 and built in the electrical insulating sheet 30.

The second wiring board 20 includes an electrical insulating base 21, a second wiring pattern 22 formed on the electrical insulating base 21 so as to face the electrical insulating sheet 30 and a surface layer wiring pattern 23 formed on the electrical insulating base 21 so as to be opposed to the second wiring pattern 22 with respect to the electrical insulating base 21.

The component built-in module 1 further includes a via conductor 32 that is formed in a via hole 31 penetrating through the electrical insulating sheet 30 and the via conductor 32 is for electrically connecting the first wiring pattern 12 and the second wiring pattern 22. A side face 32a of the via conductor 32 defines a continuous line in an axis direction of the via conductor 32. Thereby, a component built-in module having excellent reliability concerning electrical connection can be provided.

That is the explanation for the component built-in module according to Embodiment 1 of the present invention. However, the component built-in module of the present invention is not limited to the above embodiment. For instance, other electronic components may be mounted on the surface layer wiring patterns 13 and 23 of the component built-in module 1.

The following describes a method for manufacturing the component built-in module 1 according to Embodiment 1, with reference to the drawings. FIGS. 2A to D and FIGS. 3A to D referred to herein are cross-sectional views of the respective steps of the manufacturing method of the component built-in module 1. Note here that the same reference numerals are assigned to the same elements as those in FIG. 1 and their explanations are omitted.

Figure 2A:
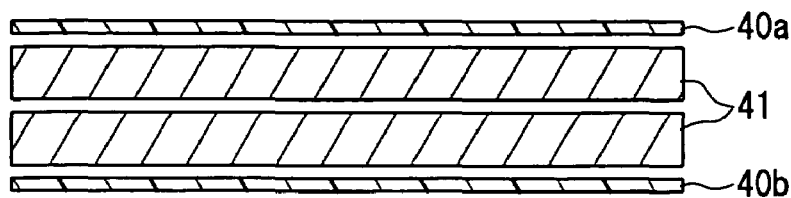
FIGS. 2A to D are cross-sectional views of the respective steps of a method for manufacturing a component built-in module according to Embodiment 1 of the present invention.
Figure 2B:
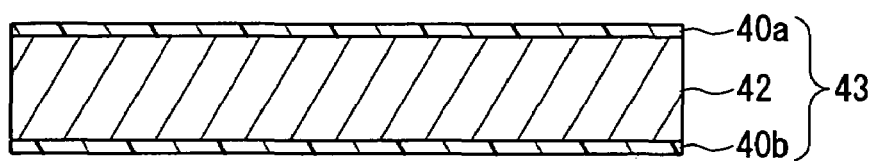

Firstly, as shown in FIG. 2A, one or more electrical insulating sheet(s) 41 each having a thickness of 100 μm are stacked so as to correspond to the thickness of the electronic component 14 to be built therein, and the thus stacked electrical insulating sheet(s) 41 are sandwiched between two protective films 40a and 40b, followed by lamination. Thereby as shown in FIG. 2B, a multilayer sheet 43 can be obtained including a first electrical insulating sheet 42 composed of the one or more electrical insulating sheet(s) 41 and the protective films 40a and 40b attached to both principal surfaces of the first electrical insulating sheet 42. Herein, one of the protective films 40a and 40b can be omitted. The above lamination can be conducted at the temperature of 100° C. and the pressure of 0.8 MPa using a vacuum lamination device, for example.

Figure 2C:
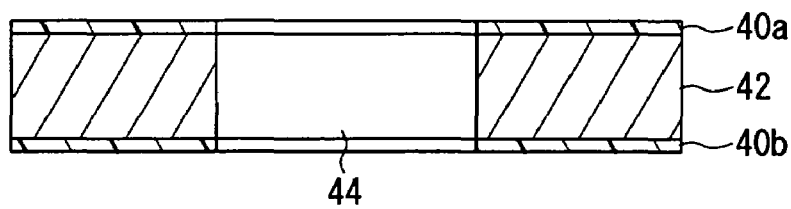

Next, as shown in FIG. 2C, a cavity 44 is formed so as to penetrate through the multilayer sheet 43 by punching, laser processing or the like.

Figure 2D:
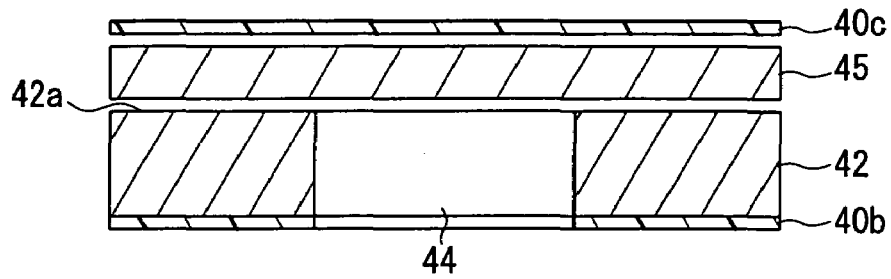
Figure 3A:
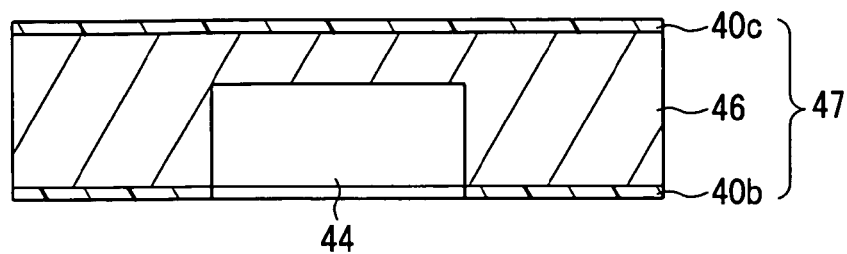
FIGS. 3A to D are cross-sectional views of the respective steps of a method for manufacturing a component built-in module according to Embodiment 1 of the present invention.

Subsequently, as shown in FIG. 2D, after only one of the protective films (in FIG. 2D, the protective film 40a) is peeled off from the first electrical insulating sheet 42, a second electrical insulating sheet 45 is stacked on the principal surface 42a of the first electrical insulating sheet 42, to which the protective film 40a was attached, so as to cover the cavity 44. Further, a new protective film 40c is stacked on the second electrical insulating sheet 45, followed by lamination for integration of these elements. Thereby as shown in FIG. 3A, a multilayer sheet 47 can be obtained including a third electrical insulating sheet 46 composed of the first electrical insulating sheet 42 and the second electrical insulating sheet 45 and the protective films 40b and 40c attached to both principal surfaces of the third electrical insulating sheet 46.

Note here that regarding the lamination conditions for forming the multilayer sheet 47, it is desired to obtain the adhesiveness between the respective layers but not to change the dimensions of the cavity 44. For example, in the case where a composite sheet made of 80 weight % of SiO$_2$ filler, a 19.5 weight % of thermosetting resin composition containing epoxy resin as a main component and a 0.5 weight % of remaining solvent is used as the first electrical insulating sheet 42 and the second electrical insulating sheet 45, the temperature at 50° C. and the pressure at 0.4 MPa were optimum for the lamination conditions. In the case where the cavity 44 before the lamination is processed to have dimensions of 10 mm×10 mm×0.4 mm in depth, the lamination under these conditions could suppress the variation in the dimension perpendicular to the depth direction of the cavity 44 to 0.3 mm or less.

Figure 3B:
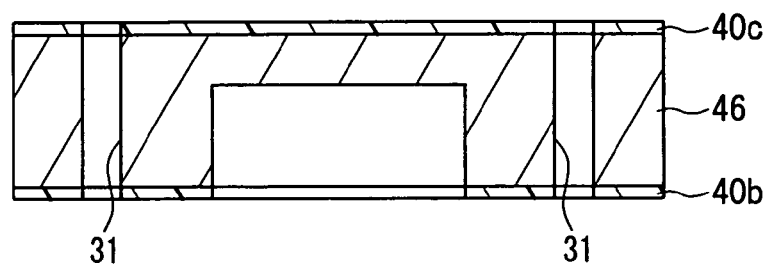

Subsequently, as shown in FIG. 3B, a via hole 31 is formed so as to penetrate through the multilayer sheet 47 by punching, laser processing or the like.

Figure 3C:
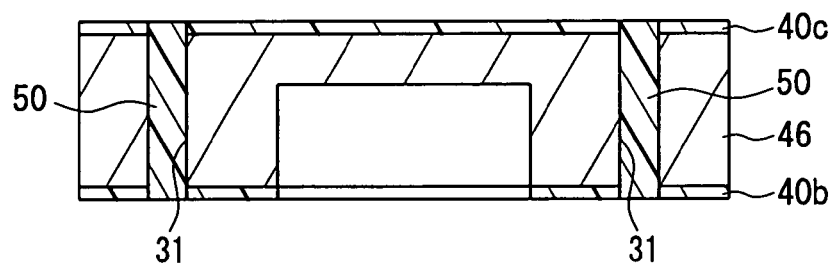

Next, as shown in FIG. 3C, the via hole 31 is filled with a conductive resin paste 50 by printing or the like.

Figure 3D:
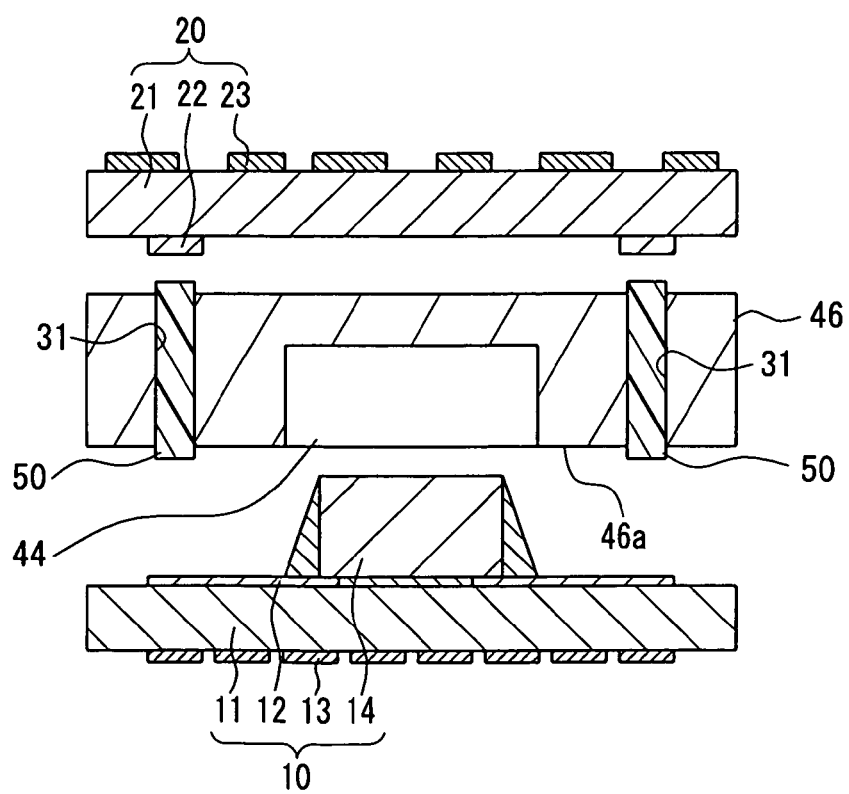

Subsequently, as shown in FIG. 3D, the protective films 40b and 40c are peeled off from the third electrical insulating sheet 46, the first wiring board 10 is disposed so as to face a principal surface 46a of the third electrical insulating sheet 46 at which the cavity 44 has been formed, and the second wiring board 20 is disposed so as to be opposed to the first wiring board 10 with respect to the third electrical insulating sheet 46.

Then, the first wiring board 10, the third electrical insulating sheet 46 and the second wiring board 20 are aligned and stacked so that the electronic component 14 is built in the cavity 44 and the via hole 31 is disposed between the first wiring pattern 12 and the second wiring pattern 22. Then, heat and pressure are applied thereto by hot pressing. Thereby, the first wiring pattern 12 and the second wiring pattern 22 are connected electrically through the via conductor 32 (see FIG. 1) made of the conductive resin paste 50, whereby the component built-in module 1 (see FIG. 1) can be obtained. The above hot pressing may be performed at the temperature of 200° C. and at the pressure of 3 MPa, for example.

According to the above-stated manufacturing method, after the second electrical insulating sheet 45 for preventing the interference between the built-in electronic component 14 and the second wiring board 20 is laminated to the first electrical insulating sheet 42 with the cavity 44 penetrating therethrough, the via hole 31 is formed so as to penetrate therethrough. Therefore, misalignment of the via conductor 32 as described in the conventional technology does not occur. Thereby, a component built-in module having excellent reliability concerning electrical connection can be provided.

The following describes a preferable method for filling the via hole 31 with the conductive resin paste 50 in the above-stated method for manufacturing the component built-in module 1. FIGS. 4A to C and FIGS. 5A to C referred to herein are cross-sectional views of the respective steps of the filling method. For the sake of clarity, in FIGS. 4A to C and FIGS. 5A to C, the width of the application region of the conductive resin paste 50 is illustrated to be relatively larger than the depth of the via hole 31.

Figure 4A:
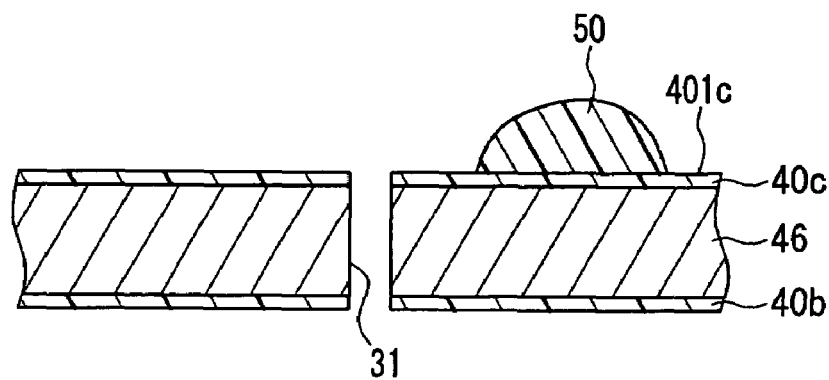
FIGS. 4A to C are cross-sectional views of the respective steps of a method for filling a via hole with a conductive resin paste, which is for filing while forming a paste layer.

Firstly, as shown in FIG. 4A, the conductive resin paste 50 is disposed on a principal surface 401c of the protective film 40c attached to the third electrical insulating sheet 46.

Figure 4B:
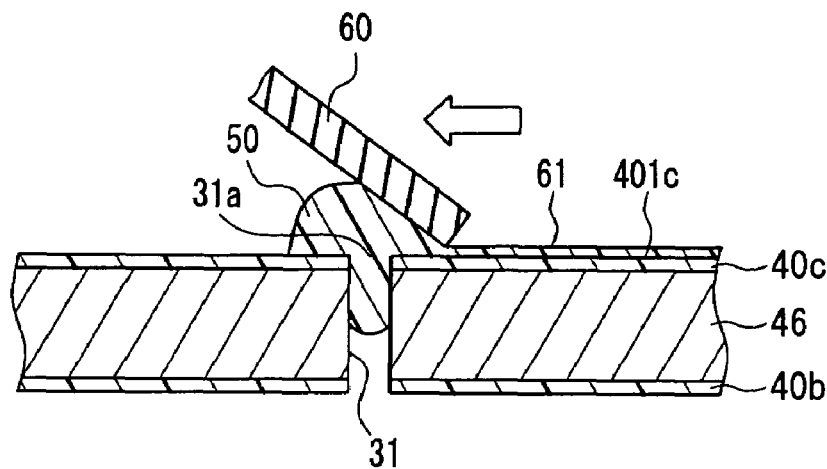

Next, as shown in FIG. 4B, the conductive resin paste 50 is applied using a squeegee 60 made of urethane rubber, for example, over the principal surface 401c of the protective film 40c so that a paste layer 61 of the conductive resin paste 50 with a predetermined thickness is formed around an opening 31a of the via hole 31 on the principal surface 401c of the protective film 40c, while filling the via hole 31 with the conductive resin paste 50.

Figure 4C:
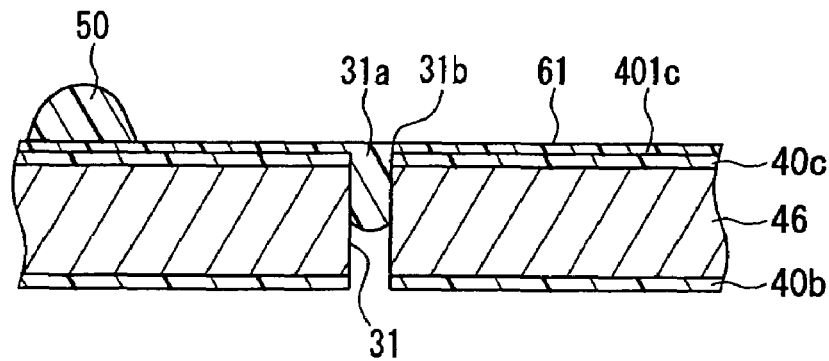

At the time when the above application operation (hereinafter called a first application operation) is completed, as shown in FIG. 4C, the paste layer 61 is formed on the principal surface 401c of the protective film 40c and further a part of the via hole 31 is filled with the conductive resin paste 50. Herein, although there is no need to form the paste layer 61 all over the principal surface 401c of the protective film 40c, it is preferable that the paste layer 61 be formed on the opening 31a of the via hole 31 and at the region within at least 300 μm from the edge 31b of the opening 31a. In the case where the paste layer 61 is to be formed only at a predetermined region from the opening 31a of the via hole 31, a screen having pores bored at a region corresponding to the predetermined region can be used, for example, for applying the conductive resin paste 50.

Figure 5A:
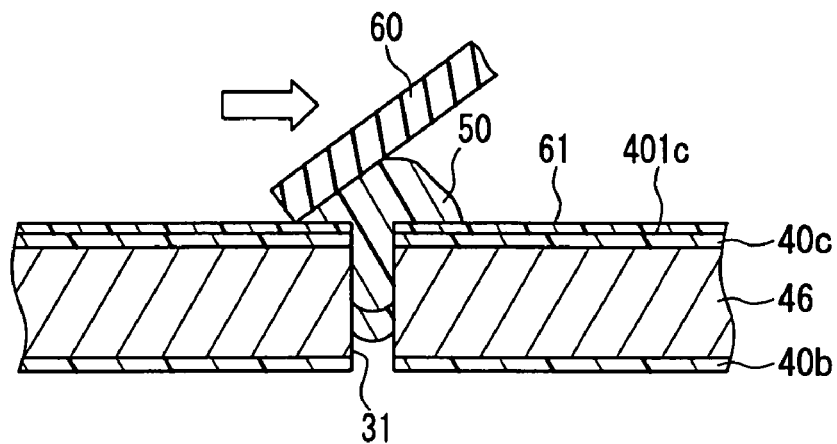
FIGS. 5A to C are cross-sectional views of the respective steps of a method for filling a via hole with a conductive resin paste, which is for filling while forming a paste layer.

Next, as shown in FIG. 5A, using the remaining conductive resin paste 50 on the principal surface 401c of the protective film 40c (see FIG. 4C), such a conductive resin paste 50 is applied again over the principal surface 401c of the protective film 40c in a similar manner to the first application operation so that a predetermined thickness of the paste layer 61 can be formed and the via hole 31 again can be filled with the conductive resin paste 50 (hereinafter called a second application operation).

Figure 5B:
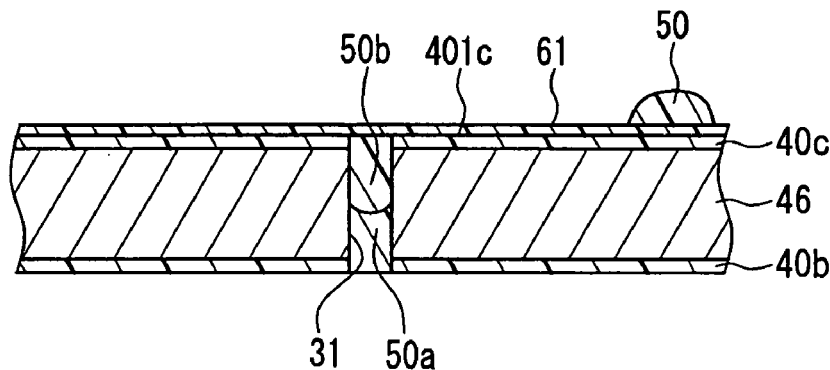

At the time when the second application operation is completed, as shown in FIG. 5B, the paste layer 61 is formed on the principal surface 401c of the protective film 40c and further the via hole 31 is filled entirely with the conductive resin paste 50. Further, there are no bubbles entering between the conductive resin paste 50a charged in the via hole 31 during the first application operation and the conductive resin paste 50b charged in the via hole 31 during the second application operation (the reason for this will be described later).

Figure 5C:
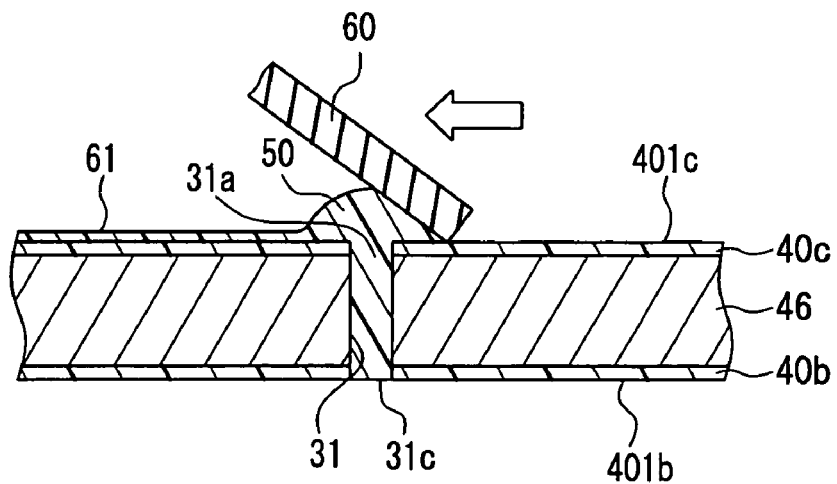

Then, as shown in FIG. 5C, the paste layer 61 is scraped off from the principal surface 401c of the protective film 40c using the squeegee 60, while filling the via hole 31 with the conductive resin paste 50 (hereinafter called a scraping operation). At this time, when a thin paper (not illustrated) having air permeability is attached to a principal surface 401b of the protective film 40b, this thin paper can prevent the conductive resin paste 50 from being squeezed out of the opening 31c opposite to the opening 31a of the via hole 31.

That is a preferable method for filling the via hole 31 with the conductive resin paste 50. However, other methods for filling with the conductive resin paste 50 may be used. For instance, the application conditions may be adjusted so that the via hole 31 is filled entirely with the conductive resin paste 50 during the scraping operation. In the above filling method, the application operation is performed by the two separated operations. However, the number of application operations may be set appropriately depending on the diameter and the depth of the via hole 31, and for example, the application operation may be performed once or three times or more.

Further, before or during the scraping operation, a part of the resin composition of the conductive resin paste 50 charged in the via hole 31 may be sucked through the opening 31c of the via hole 31. This is for increasing the density of the conductive powder in the conductive resin paste 50 charged in the via hole 31, thus reducing electrical resistance of the via conductor 32 formed (see FIG. 1).

Figure 6A:
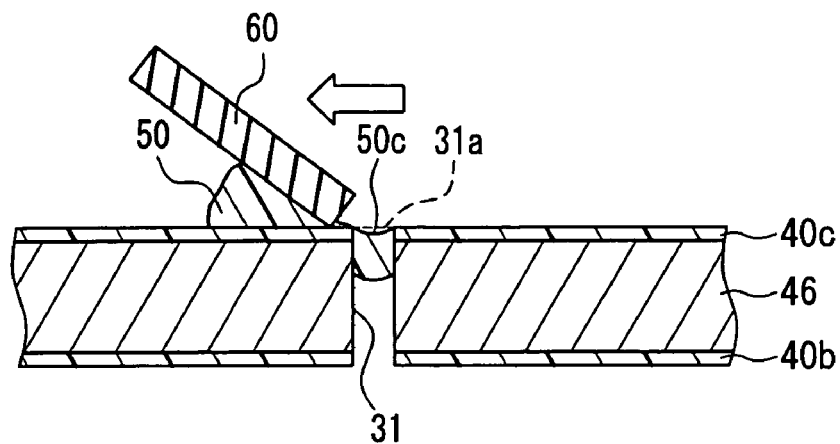
FIGS. 6A to C are cross-sectional views of the respective steps of a method for filling a via hole with a conductive resin paste, which is for filling without forming a paste layer.
Figure 6B:
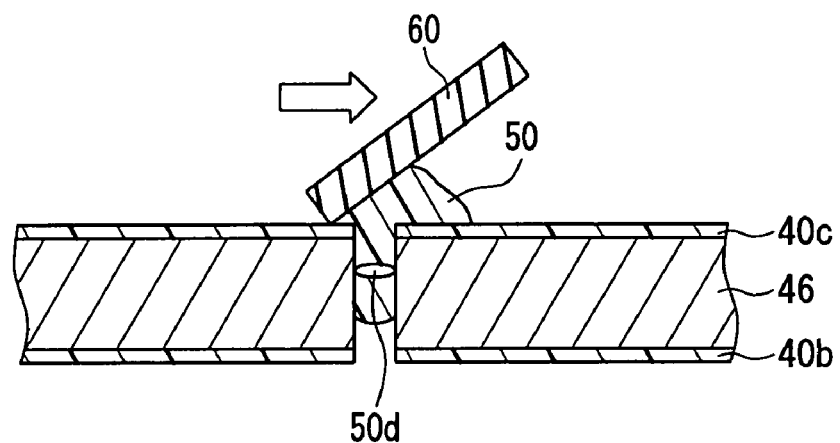
Figure 6C:
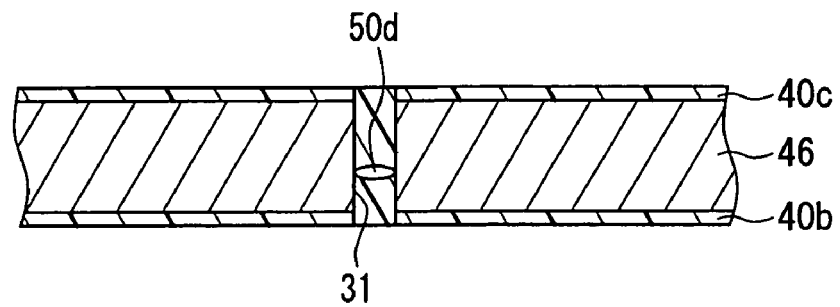

Meanwhile, if the via hole 31 is filled with the conductive resin paste 50 by a conventional method in which the paste layer 61 is not formed (see FIG. 4B) as shown in FIG. 6A, a hollow 50c may be generated in the vicinity of the opening 31a of the via hole 31. Conceivably, this results from a slight amount of the conductive resin paste 50 being pulled out of the via hole 31 when the squeegee 60 passes over the opening 31a of the via hole 31. If the hollow 50c is generated, such a hollow 50c is caught in the conductive resin paste 50 charged during the second filling operation as shown in FIG. 6B, thus generating a bubble 50d. The bubble 50d may remain in the via hole 31 even after the completion of the filling operation of FIG. 6C.

Figure 7:
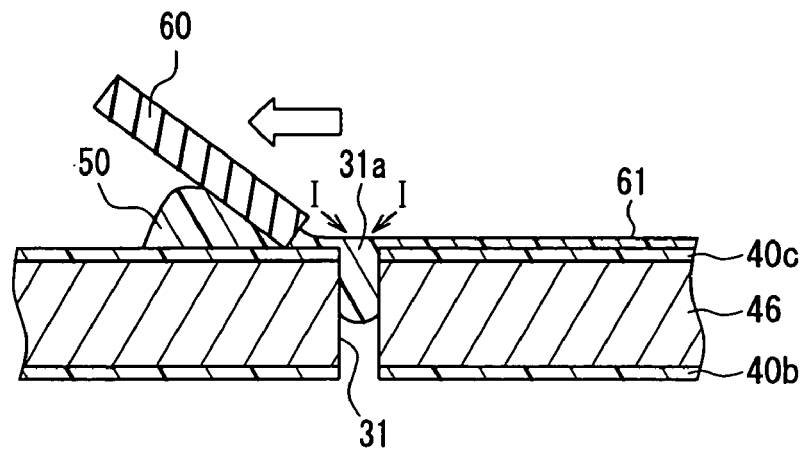
FIG. 7 is a cross-sectional view showing the state where a paste layer with a predetermined thickness is formed around an opening of a via hole.

On the other hand, according to the filling method including the above-stated application operation, even if a slight amount of the conductive resin paste 50 is pulled out of the via hole 31 when the squeegee 60 passes over the opening 31a of the via hole 31, since the paste layer 61 is formed around the opening 31a of the via hole 31 as shown in FIG. 7, the conductive resin paste 50 making up the paste layer 61 flows into the via hole 31 from the arrows I in the drawing, and therefore the conductive resin paste 50 can be charged without the generation of the hollow 50c as shown in FIG. 6A.

EMBODIMENT 2

Figure 8:
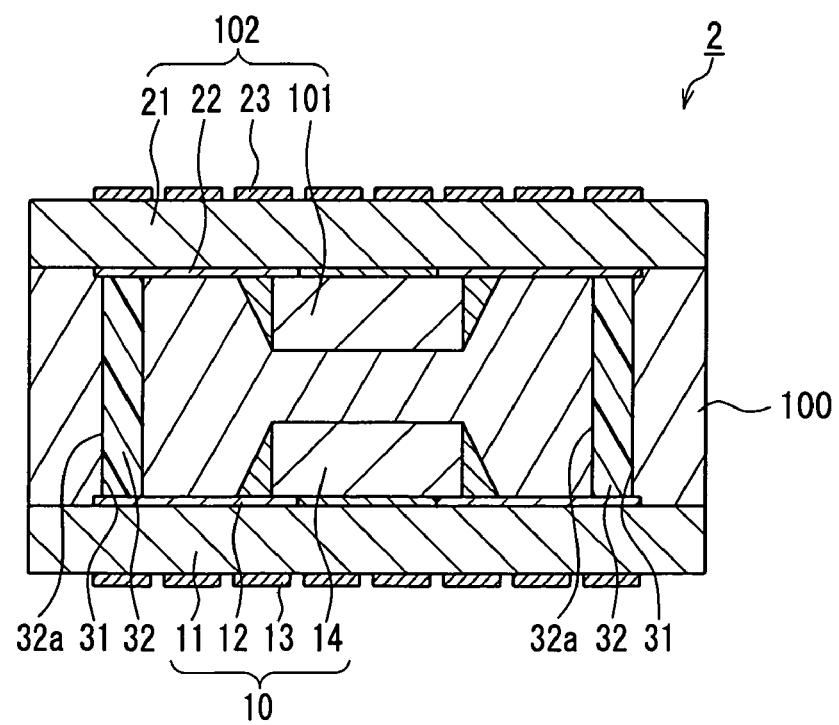
FIG. 8 is a cross-sectional view of a component built-in module according to Embodiment 2 of the present invention.

The following describes a component built-in module according to Embodiment 2 of the present invention. FIG. 8 referred to herein is a cross-sectional view of the component built-in module according to Embodiment 2. Note here that the same reference numerals are assigned to the same elements as those in FIG. 1 and their explanations are omitted.

As shown in FIG. 8, in a component built-in module 2, a second wiring board 102 further includes an electronic component 101 mounted on a second wiring pattern 22. This electronic component 101 is built in an electrical insulating sheet 100 so as to be opposed to an electronic component 14. The other configuration is the same as that of the above-stated component built-in module 1 (see FIG. 1). Therefore, the component built-in module 2 also has a side face 32a of a via conductor 32 defining a continuous line in an axis direction of the via conductor 32. Thereby, a component built-in module having excellent reliability concerning electrical connection can be provided.

The following describes a method for manufacturing the component built-in module 2 according to Embodiment 2. FIGS. 9A to D and FIG. 10 referred to herein are cross-sectional views of the respective steps of the manufacturing method of the component built-in module 2. Note here that the same reference numerals are assigned to the same elements as those in FIG. 2, FIG. 3 and FIG. 8 and their explanations are omitted.

Figure 9A:
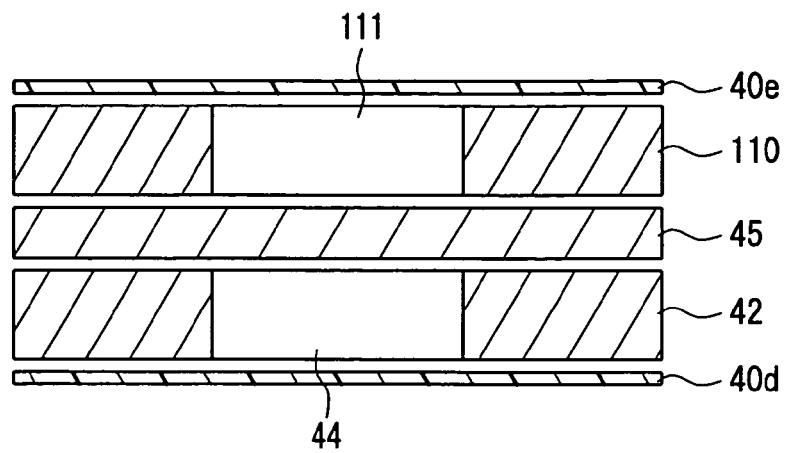
FIGS. 9A to D are cross-sectional views of the respective steps of a method for manufacturing a component built-in module according to Embodiment 2 of the present invention.
Figure 9B:
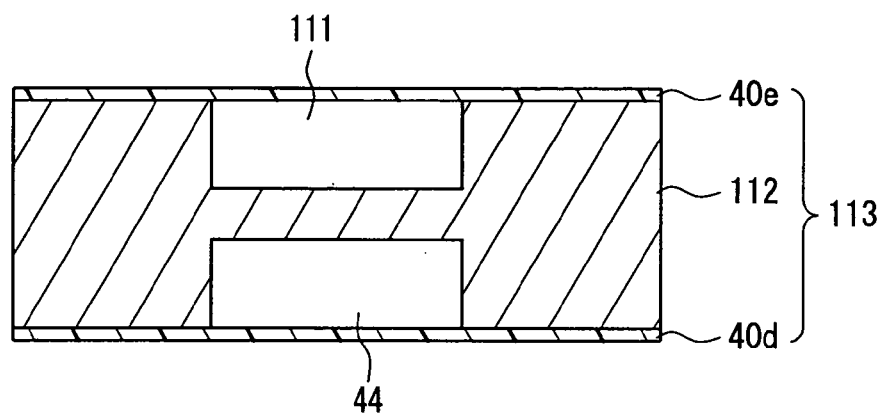

Firstly, as shown in FIG. 9A, a second electrical insulating sheet 45 is sandwiched between a first electrical insulating sheet 42 with a cavity 44 formed therein and a fourth electrical insulating sheet 110 with a cavity 111 formed therein, which further is sandwiched between protective films 40d and 40e, followed by lamination. Thereby, as shown in FIG. 9B, a multilayer sheet 113 can be obtained, including a third electrical insulating sheet 112 composed of the first electrical insulating sheet 42, the second electrical insulating sheet 45 and the fourth electrical insulating sheet 110, and the protective films 40d and 40e attached to both principal surfaces of the third electrical insulating sheet 112. The second electrical insulating sheet 45 functions so as to prevent the interference between the built-in electronic components 14 and 101. As the first electrical insulating sheet 42, the electrical insulating sheet obtained by peeling the protective films 40a and 40b off from the state shown in FIG. 2C of the above-stated method for manufacturing the component built-in module 1 can be used. As the fourth electrical insulating sheet 110, an electrical insulating sheet similar to the first electrical insulating sheet 42 can be used.

Figure 9C:
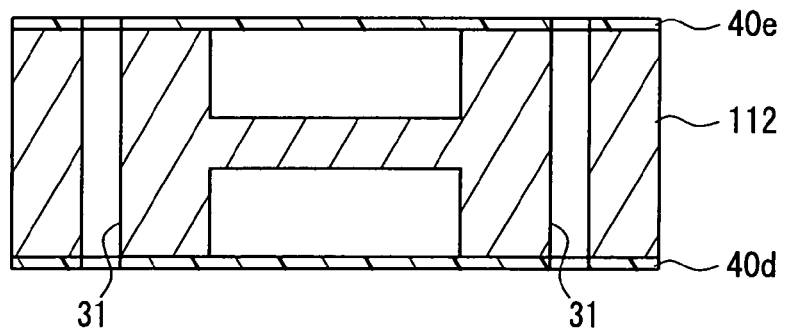

Subsequently, as shown in FIG. 9C, a via hole 31 is formed by punching, laser processing or the like so as to penetrate through the multilayer sheet 113.

Figure 9D:
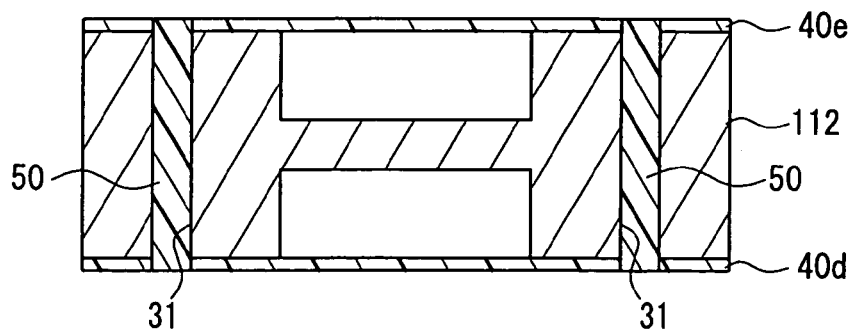

Next, as shown in FIG. 9D, the via hole 31 is filled with a conductive resin paste 50 by printing or the like.

Figure 10:
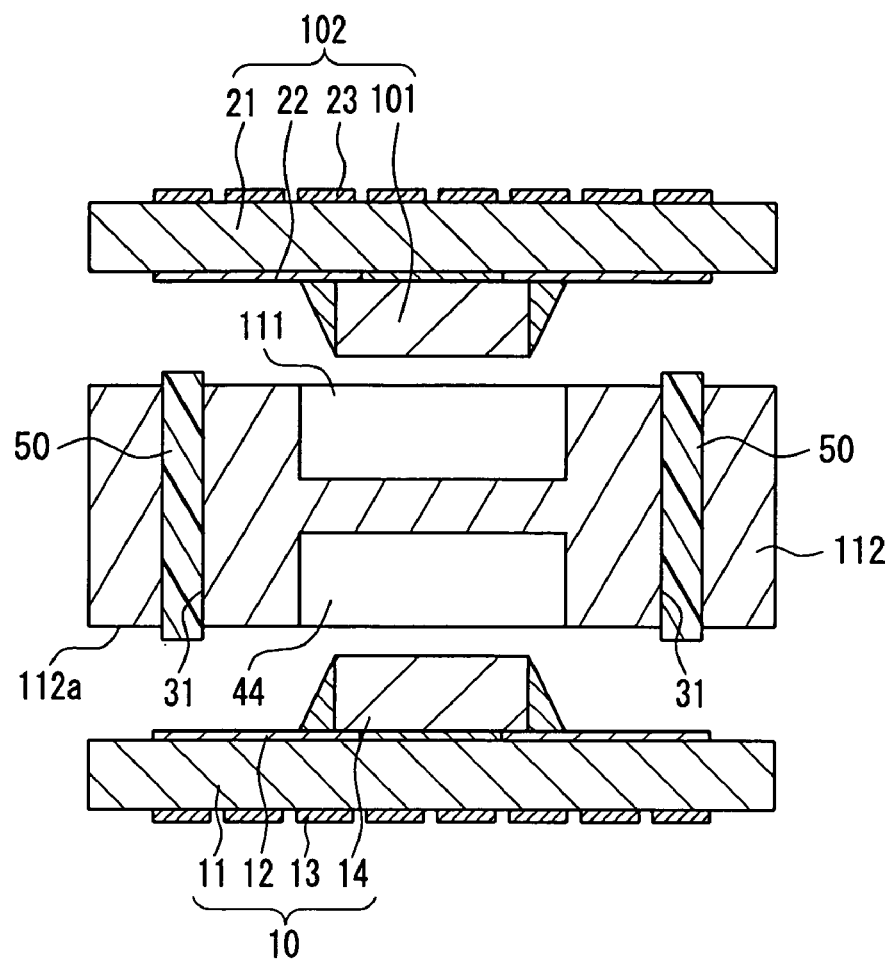
FIG. 10 is a cross-sectional view for explaining a method for manufacturing a component built-in module according to Embodiment 2 of the present invention.

Subsequently, as shown in FIG. 10, the protective films 40d and 40e are peeled off from the third electrical insulating sheet 112, and a first wiring board 10 is disposed so as to face a principal surface 112a of the third electrical insulating sheet 112 at which the cavity 44 has been formed, and a second wiring board 102 is disposed so as to be opposed to the first wiring board 10 with respect to the third electrical insulating sheet 112.

Then, the first wiring board 10, the third electrical insulating sheet 112 and the second wiring board 102 are aligned and stacked so that the electronic components 14 and 101 are built in the cavities 44 and 111, respectively, and the via hole 31 is disposed between the first wiring pattern 12 and the second wiring pattern 22. Then, heat and pressure are applied thereto by hot pressing. Thereby, the first wiring pattern 12 and the second wiring pattern 22 are connected electrically through the via conductor 32 (see FIG. 8) made of the conductive resin paste 50, whereby the component built-in module 2 (see FIG. 8) can be obtained. According to the above-stated manufacturing method, a plurality of electronic components can be disposed three-dimensionally in the third electrical insulating sheet 112.

EMBODIMENT 3

Figure 11:
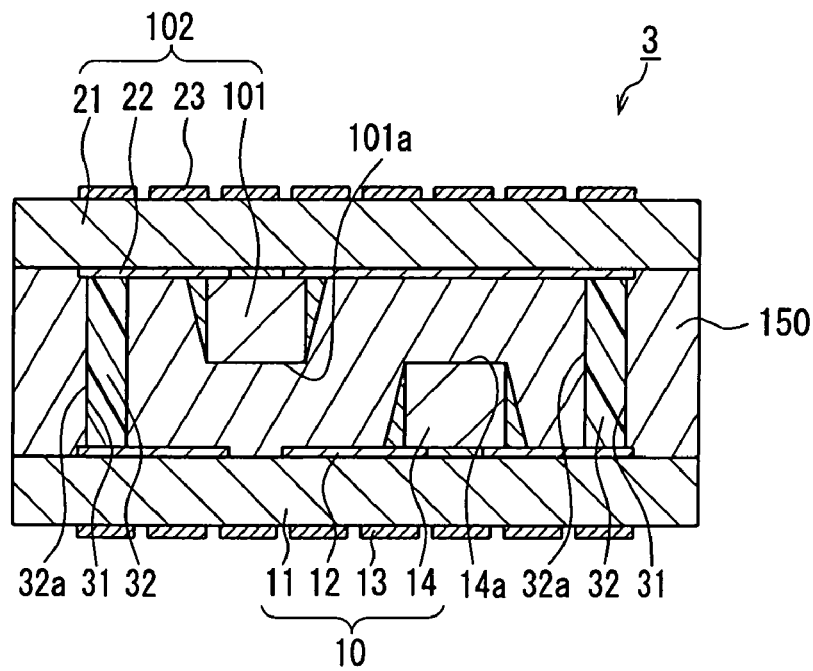
FIG. 11 is a cross-sectional view of a component built-in module according to Embodiment 3 of the present invention.

The following describes a component built-in module according to Embodiment 3 of the present invention. FIG. 11 referred to herein is a cross-sectional view of the component built-in module according to Embodiment 3. Note here that the same reference numerals are assigned to the same elements as those in FIG. 8 and their explanations are omitted.

As shown in FIG. 11, in a component built-in module 3, electronic components 101 and 14 are built in an electrical insulating sheet 150 at positions so that they are not opposed to each other. Since the electronic components 101 and 14 are not opposed to each other, the component built-in module 3 does not have any electrical insulating layer for preventing the interference between an end face 101a of the electronic component 101 and an end face 14a of the electronic component 14. The other configuration is the same as that of the above-stated component built-in module 2 (see FIG. 8). Therefore, the component built-in module 3 also has a side face 32a of a via conductor 32 defining a continuous line in an axis direction of the via conductor 32. Thereby, a component built-in module having excellent reliability concerning electrical connection can be provided.

The following describes a method for manufacturing the component built-in module 3 according to Embodiment 3. FIGS. 12A to C and FIGS. 13A and 13B referred to herein are cross-sectional views of the respective steps of the manufacturing method of the component built-in module 3. Note here that the same reference numerals are assigned to the same elements as those in FIGS. 9 to 11 and their explanations are omitted.

Figure 12A:
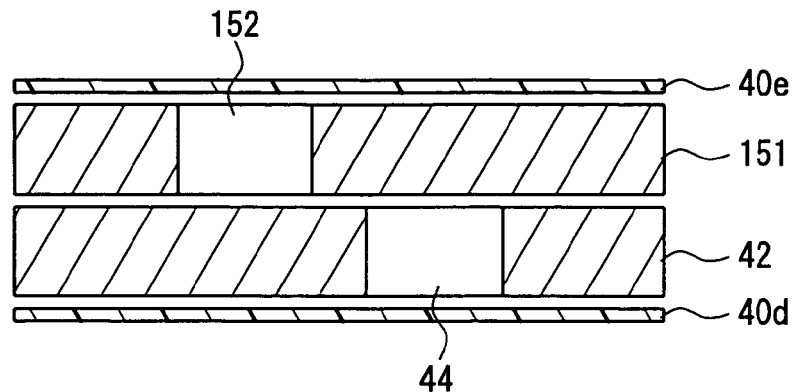
FIGS. 12A to C are cross-sectional views of the respective steps of a method for manufacturing a component built-in module according to Embodiment 3 of the present invention.
Figure 12B:
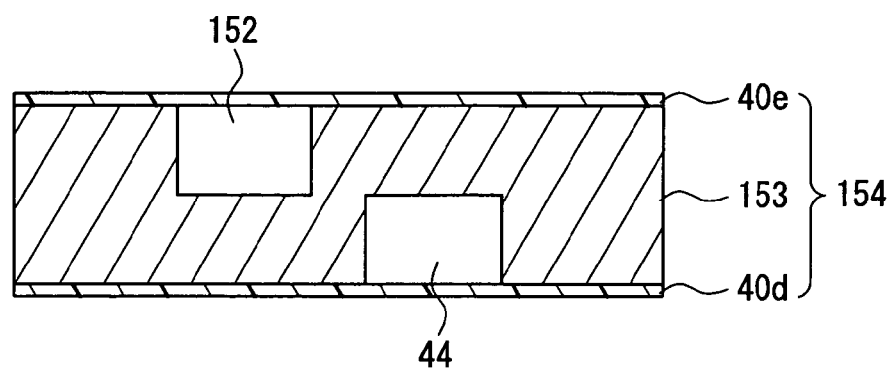

Firstly, as shown in FIG. 12A, a first electrical insulating sheet 42 with a cavity 44 formed therein and a second electrical insulating sheet 151 with a cavity 152 formed therein are stacked so that the cavity 44 and the cavity 152 are not overlapped. Then this further is sandwiched between protective films 40d and 40e, followed by lamination. Thereby, as shown in FIG. 12B, a multilayer sheet 154 can be obtained, including a third electrical insulating sheet 153 composed of the first electrical insulating sheet 42 and the second electrical insulating sheet 151, and the protective films 40d and 40e attached to the both principal surfaces of the third electrical insulating sheet 153. As the second electrical insulating sheet 151, an electrical insulating sheet similar to the first electrical insulating sheet 42 can be used.

Figure 12C:
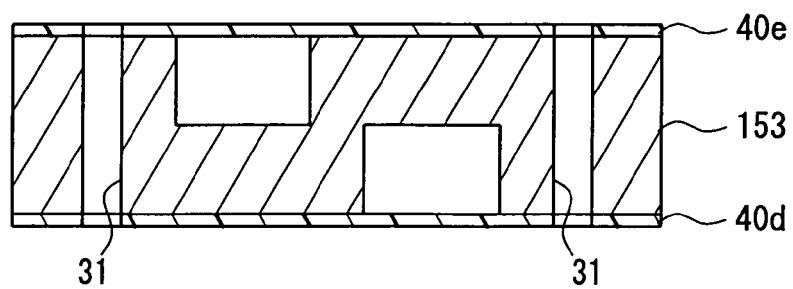

Subsequently, as shown in FIG. 12C, a via hole 31 is formed by punching, laser processing or the like so as to penetrate through the multilayer sheet 154.

Figure 13A:
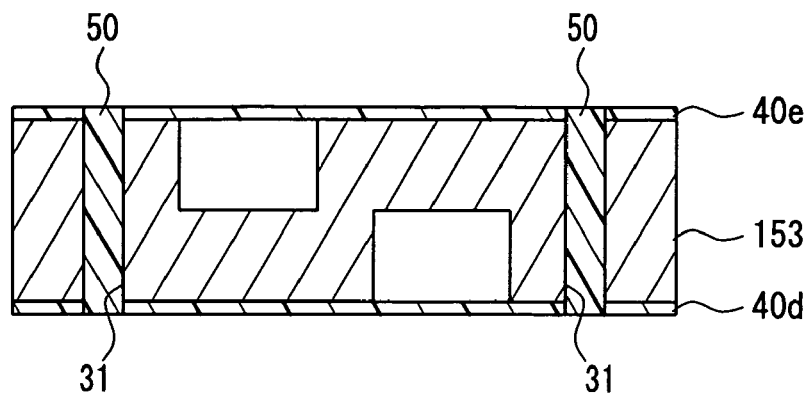
FIGS. 13A and B are cross-sectional views of the respective steps of a method for manufacturing a component built-in module according to Embodiment 3 of the present invention.

Next, as shown in FIG. 13A, the via hole 31 is filled with a conductive resin paste 50 by printing or the like.

Figure 13B:
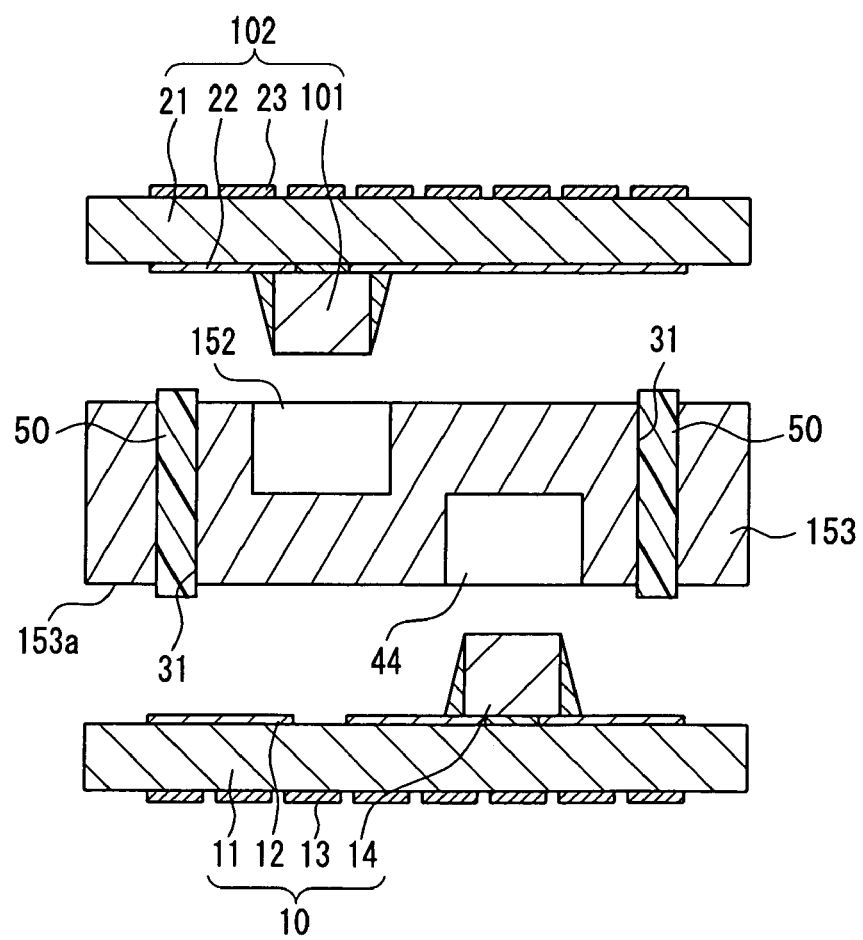

Subsequently, as shown in FIG. 13B, the protective films 40d and 40e are peeled off from the third electrical insulating sheet 153, and a first wiring board 10 is disposed so as to face a principal surface 153a of the third electrical insulating sheet 153 at which the cavity 44 has been formed, and a second wiring board 102 is disposed so as to be opposed to the first wiring board 10 with respect to the third electrical insulating sheet 153.

Then, the first wiring board 10, the third electrical insulating sheet 153 and the second wiring board 102 are aligned and stacked so that the electronic components 14 and 101 are built in the cavities 44 and 152, respectively, and the via hole 31 is disposed between the first wiring pattern 12 and the second wiring pattern 22. Then, heat and pressure are applied thereto by hot pressing. Thereby, the first wiring pattern 12 and the second wiring pattern 22 are connected electrically through the via conductor 32 (see FIG. 11) made of the conductive resin paste 50, whereby the component built-in module 3 (see FIG. 11) can be obtained. According to the above-stated manufacturing method, the electrical insulating sheet for preventing the interference between the electronic components 14 and 101 as explained in Embodiment 2 is not required. Therefore, the third electrical insulating sheet 153 can be made thinner.

EMBODIMENT 4

Figure 14:
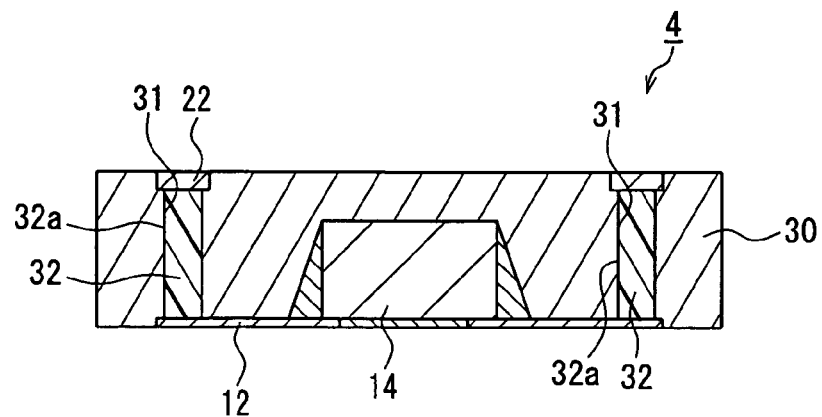
FIG. 14 is a cross-sectional view of a component built-in module according to Embodiment 4 of the present invention.

The following describes a component built-in module according to Embodiment 4 of the present invention. FIG. 14 referred to herein is a cross-sectional view of the component built-in module according to Embodiment 4. Note here that the same reference numerals are assigned to the same elements as those in FIG. 1 and their explanations are omitted.

As shown in FIG. 14, the component built-in module 4 does not have the electrical insulating bases 11 and 21 and the surface layer wiring patterns 13 and 23 as in the configuration of the above-stated component built-in module 1 (see FIG. 1). The other configuration is the same as that of the above-stated component built-in module 1. Therefore, the component built-in module 4 also has a side face 32a of a via conductor 32 defining a continuous line in an axis direction of the via conductor 32. Thereby, a component built-in module having excellent reliability concerning electrical connection can be provided.

The following describes a method for manufacturing the component built-in module 4 according to Embodiment 4. FIGS. 15A to C and FIGS. 16A and B referred to herein are cross-sectional views of the respective steps of the manufacturing method of the component built-in module 4. Note here that the same reference numerals are assigned to the same elements as those in FIG. 2, FIG. 3 and FIG. 14 and their explanations are omitted.

Figure 15A:
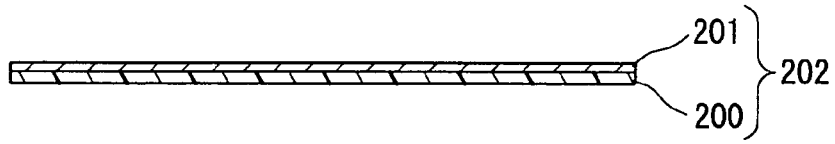
FIGS. 15A to C are cross-sectional views of the respective steps of a method for manufacturing a component built-in module according to Embodiment 4 of the present invention.
Figure 15B:
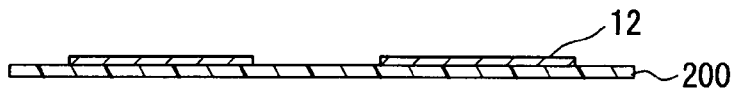

Firstly, as shown in FIG. 15A, a multilayer sheet 202 is prepared, including a supporting member 200 and a copper foil 201 that are stacked. Then, as shown in FIG. 15B, patterning is applied to the copper foil 201 using photolithography technology so as to form a first wiring pattern 12.

Figure 15C:
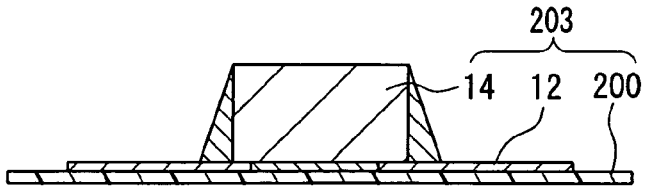
Figure 16A:
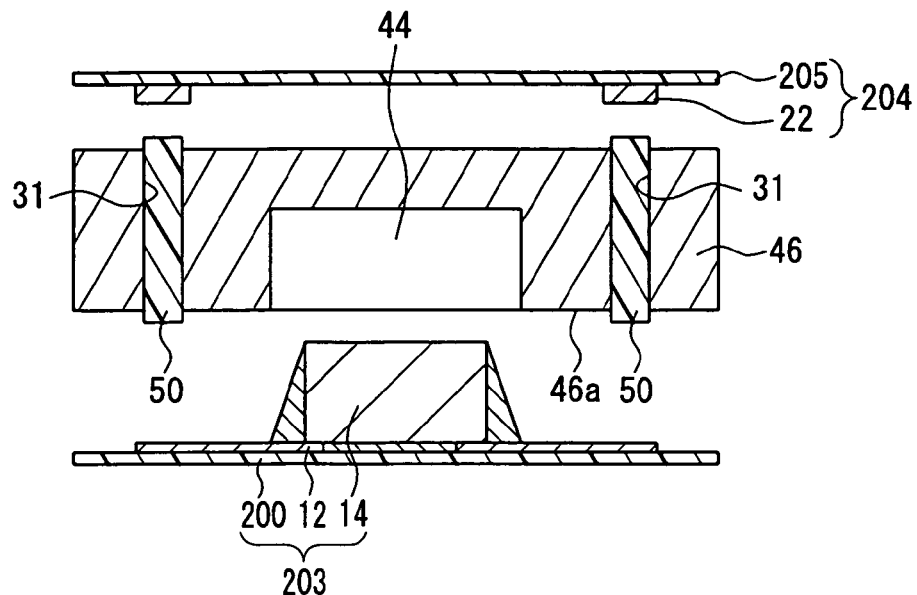
FIGS. 16A and B are cross-sectional views of the respective steps of a method for manufacturing a component built-in module according to Embodiment 4 of the present invention.

Next, as shown in FIG. 15C, an electronic component 14 is mounted on the first wiring pattern 12 so as to form a first wiring board 203. Further, a second wiring board 204 as shown in FIG. 16A is formed by a method similar to that of the first wiring board 203 except that no electronic component is mounted. The second wiring board 204 includes a supporting member 205 and a second wiring pattern 22 formed on the supporting member 205.

Then, as shown in FIG. 16A, a third electrical insulating sheet 46 is prepared by a method similar to that of Embodiment 1 so that a cavity 44 is formed therein and a via hole 31 is filled with a conductive resin paste 50. Subsequently, a first wiring board 203 is disposed so as to face a principal surface 46a of the third electrical insulating sheet 46 at which the cavity 44 has been formed, and a second wiring board 204 is disposed so as to be opposed to the first wiring board 203 with respect to the third electrical insulating sheet 46.

Figure 16B:
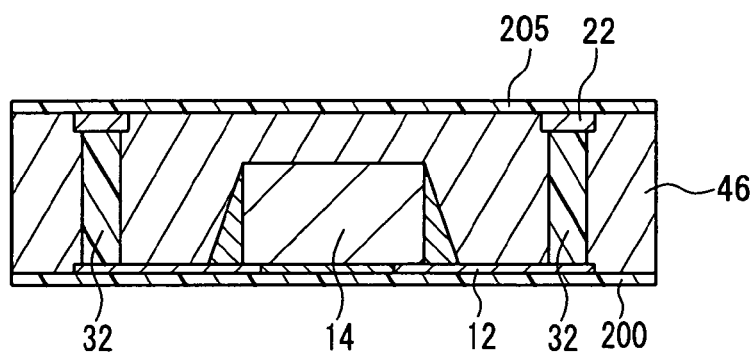

Then, the first wiring board 203, the third electrical insulating sheet 46 and the second wiring board 204 are aligned and stacked so that the electronic component 14 is built in the cavity 44, and the via hole 31 is disposed between the first wiring pattern 12 and the second wiring pattern 22. Then, heat and pressure are applied thereto by hot pressing. Thereby, as shown in FIG. 16B, the first wiring pattern 12 and the second wiring pattern 22 are connected electrically through the via conductor 32 made of the conductive resin paste 50. Then, by removing the supporting members 200 and 205 by peeling or etching, the component built-in module 4 (see FIG. 14) can be obtained. According to the above-stated manufacturing method, since no electrical insulating bases are disposed on either principal surface of the third electrical insulating sheet 46, the component built-in module as a whole can have a low profile. Note here that the thus obtained component built-in module 4 may be substituted with the second wiring board 20 of FIG. 3D, for example, and hot pressing may be applied thereto, whereby a component built-in module with a plurality of electronic components three-dimensionally built therein can be manufactured.

EMBODIMENT 5

Figure 17:
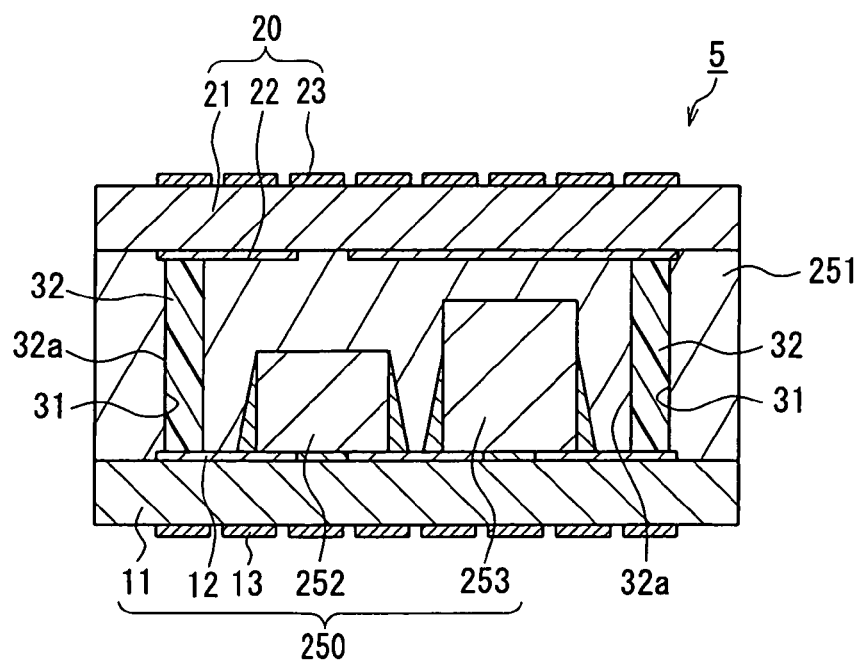
FIG. 17 is a cross-sectional view of a component built-in module according to Embodiment 5 of the present invention.

The following describes a component built-in module according to Embodiment 5 of the present invention. FIG. 17 referred to herein is a cross-sectional view of the component built-in module according to Embodiment 5. Note here that the same reference numerals are assigned to the same elements as those in FIG. 1 and their explanations are omitted.

As shown in FIG. 17, in the component built-in module 5, a first electronic component 252 and a second electronic component 253 are mounted on a first wiring pattern 12. The first and the second electronic components 252 and 253 are built in an electrical insulating sheet 251. The height of the second electronic component 253 is larger than that of the first electronic component 252. The other configuration is the same as that of the above-stated component built-in module 1 (see FIG. 1). Therefore, the component built-in module 5 also has a side face 32a of a via conductor 32 defining a continuous line in an axis direction of the via conductor 32. Thereby, a component built-in module having excellent reliability concerning electrical connection can be provided.

The following describes a method for manufacturing the component built-in module 5 according to Embodiment 5. FIGS. 18A to C and FIGS. 19A and B referred to herein are cross-sectional views of the respective steps of the manufacturing method of the component built-in module 5. Note here that the same reference numerals are assigned to the same elements as those in FIG. 2, FIG. 3, FIG. 9 and FIG. 17 and their explanations are omitted.

Figure 18A:
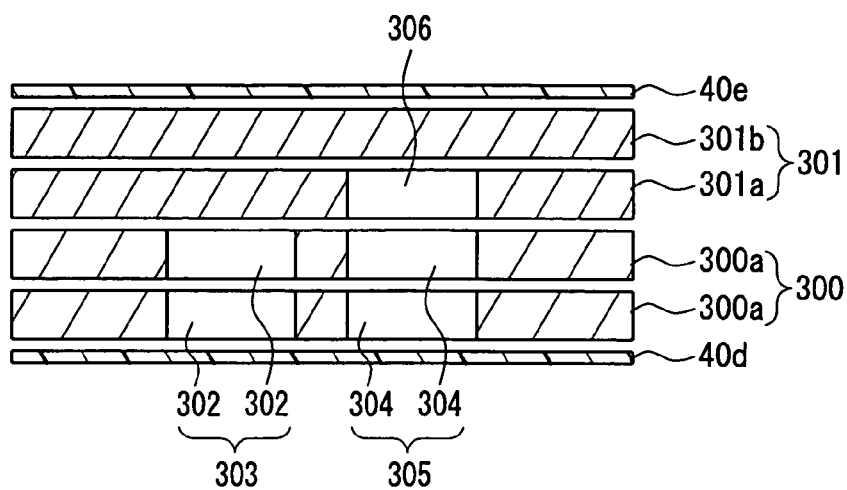
FIGS. 18A to C are cross-sectional views of the respective steps of a method for manufacturing a component built-in module according to Embodiment 5 of the present invention.

Firstly, as shown in FIG. 18A, a protective film 40d, a first electrical insulating sheet 300 composed of two electrical insulating sheets 300a, a second electrical insulating sheet 301 composed of an electrical insulating sheet 301a and an electrical insulating sheet 301b and a protective film 40e are stacked in this order from the lower side of the drawing, followed by lamination. Note here that each of the two electrical insulating sheets 300a includes cavities 302 and 304 formed so as to penetrate therethrough. The two cavities 302 and 302 are made to communicate with each other and the two cavities 304 and 304 are made to communicate with each other, whereby a first cavity 303 and a second cavity 305 are formed, respectively. Further, the electrical insulating sheet 301a further has a third cavity 306 penetrating therethrough, the third cavity 306 communicating with the second cavity 305.

Figure 18B:
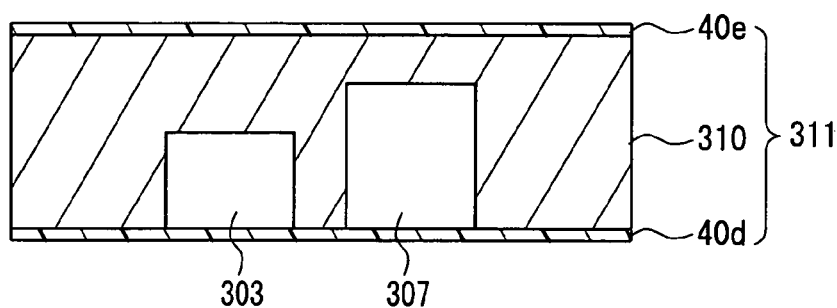

FIG. 18B shows the state after the lamination. As a result of the lamination, a multilayer sheet 311 can be obtained, including a third electrical insulating sheet 310 composed of the first electrical insulating sheet 300 and the second electrical insulating sheet 301 and the protective films 40d and 40e attached to the both principal surfaces of the third electrical insulating sheet 310. Note here that in the third electrical insulating sheet 310 the first cavity 303 and a fourth cavity 307 are formed, the fourth cavity 307 including the second cavity 305 and the third cavity 306.

Figure 18C:
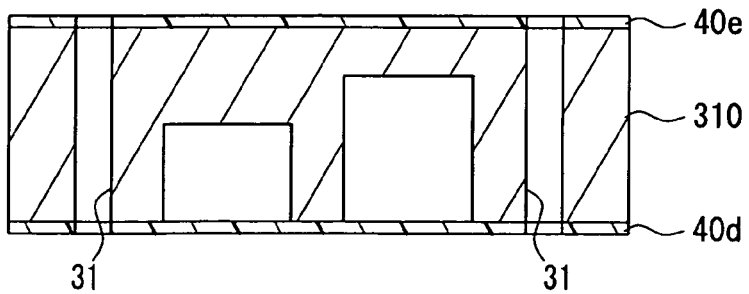

Subsequently, as shown in FIG. 18C, a via hole 31 is formed by punching, laser processing or the like so as to penetrate through the multilayer sheet 311.

Figure 19A:
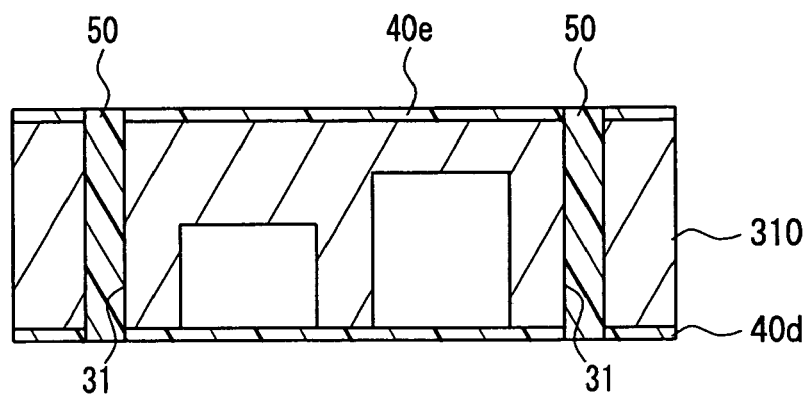
FIGS. 19A and B are cross-sectional views of the respective steps of a method for manufacturing a component built-in module according to Embodiment 5 of the present invention.

Next, as shown in FIG. 19A, the via hole 31 is filled with a conductive resin paste 50 by printing or the like.

Figure 19B:
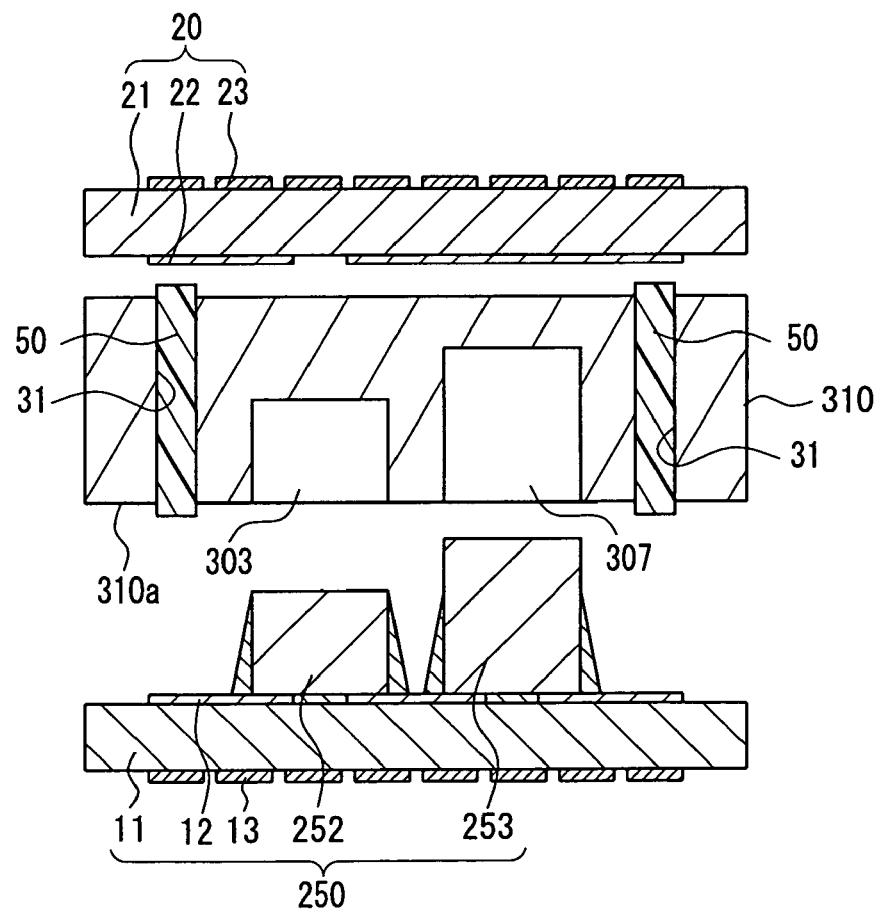
Figure 20A:
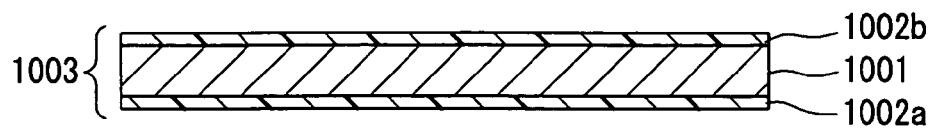
FIGS. 20A to F are cross-sectional views of the respective steps of a conventional method for manufacturing a component built-in module.
Figure 20B:
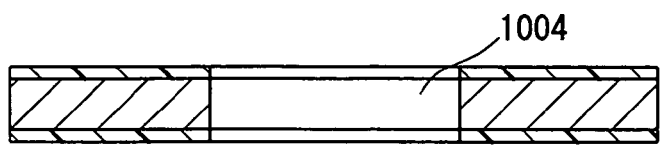
Figure 20C:
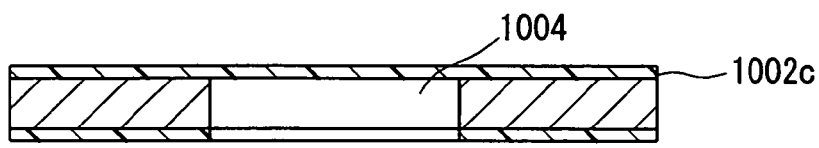
Figure 20D:
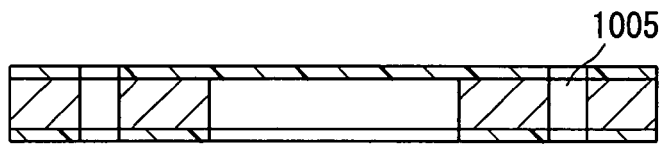
Figure 20E:
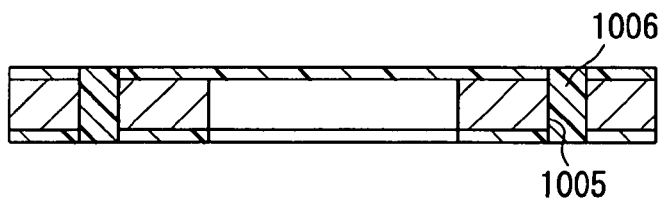
Figure 20F:
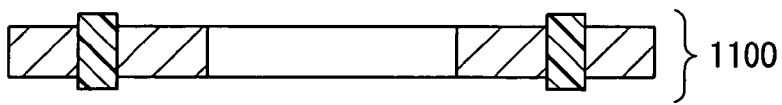
Figure 21A:
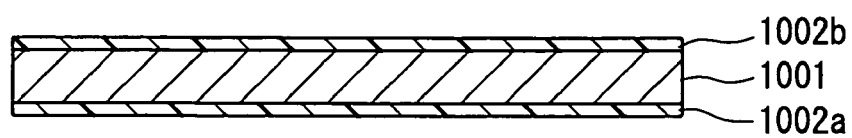
FIGS. 21A to D are cross-sectional views of the respective steps of a conventional method for manufacturing a component built-in module.
Figure 21B:
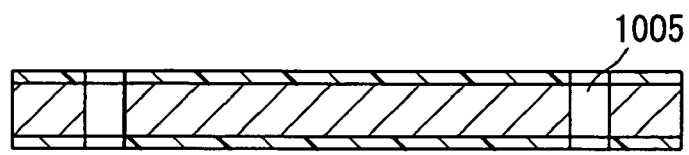
Figure 21C:
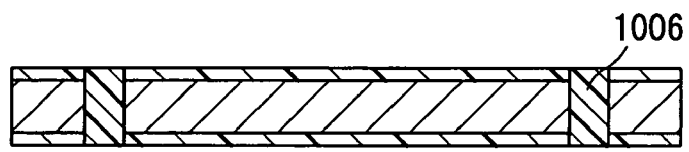
Figure 21D:
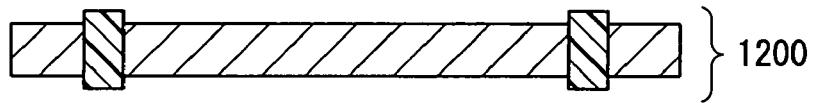
Figure 22A:
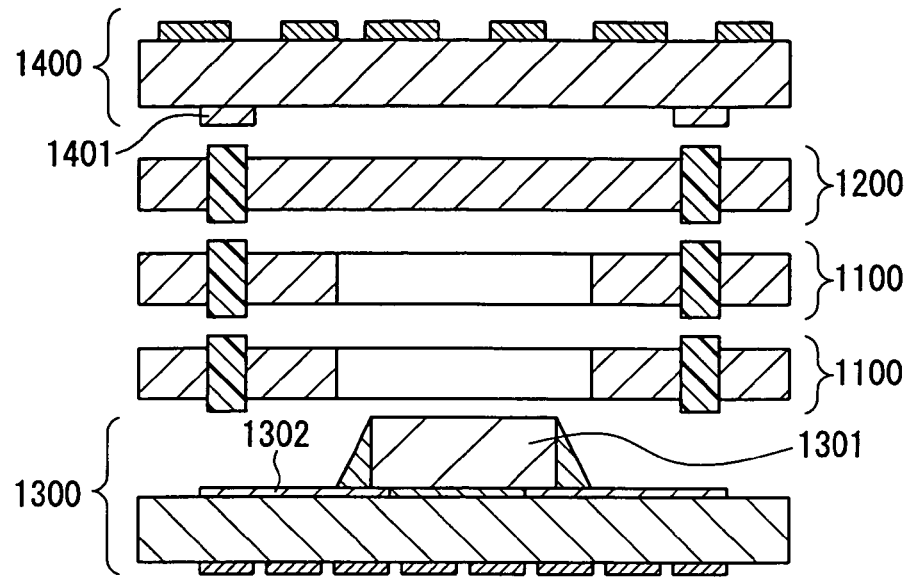
FIGS. 22A and B are cross-sectional views of the respective steps of a conventional method for manufacturing a component built-in module.
Figure 22B:
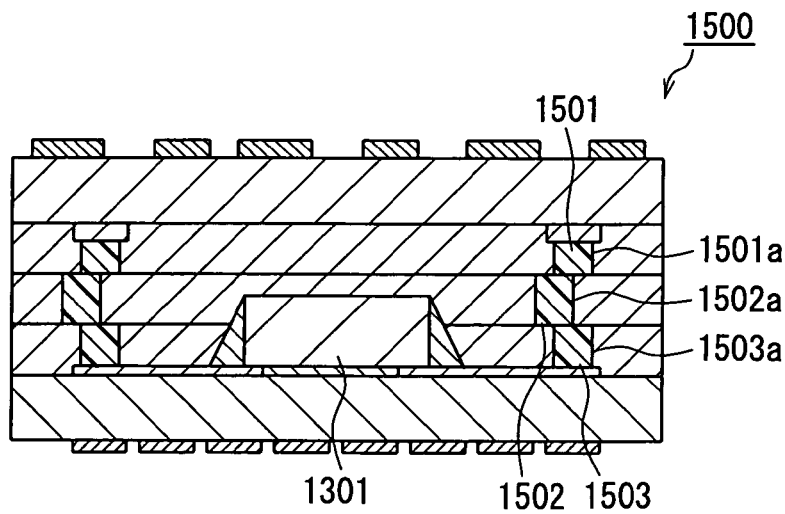

Subsequently, as shown in FIG. 19B, the protective films 40d and 40e are peeled off from the third electrical insulating sheet 310, and a first wiring board 250 is disposed so as to face a principal surface 310a of the third electrical insulating sheet 310 at which the first cavity 303 and the fourth cavity 307 have been formed, and a second wiring board 20 is disposed so as to be opposed to the first wiring board 250 with respect to the third electrical insulating sheet 310.

Then, the first wiring board 250, the third electrical insulating sheet 310 and the second wiring board 20 are aligned and stacked so that the first and the second electronic components 252 and 253 are built in the first and the fourth cavities 303 and 307, respectively, and the via hole 31 is disposed between the first wiring pattern 12 and the second wiring pattern 22. Then, heat and pressure are applied thereto by hot pressing. Thereby, the first wiring pattern 12 and the second wiring pattern 22 are connected electrically through the via conductor 32 (see FIG. 17) made of the conductive resin paste 50, whereby the component built-in module 5 (see FIG. 17) can be obtained. According to the above-stated manufacturing method, in the case where a plurality of electronic components having different heights are to be built therein, the cavities can be formed corresponding to the respective heights of the electronic components. Therefore, at the hot pressing process, for example, excessive flowing of the resin into the cavities can be suppressed.

In the above manufacturing method, the first electrical insulating sheet composed of the two electrical insulating sheets is used. However, only one thick electrical insulating sheet may be used therefor.

INDUSTRIAL APPLICABILITY

The component built-in module of the present invention has high noise immunity and high productivity, and can be made smaller. Therefore, the component built-in module of the present invention is effective for RF (Radio Frequency) modules for communication equipment, semiconductor packages and the like.

The invention claimed is:

1. A method for manufacturing a component built-in module, comprising the steps of:
on one principal surface of a first electrical insulating sheet with at least one cavity formed penetrating therethrough, laminating a second electrical insulating sheet so as to cover at least one cavity, so that a third electrical insulating sheet comprising the first electrical insulating sheet and the second electrical insulating sheet is formed;

forming a via hole so as to penetrate through the third electrical insulating sheet;

filling the via hole with a conductive resin paste;

disposing a first wiring board with a first wiring pattern and electronic components mounted on the first wiring pattern so as to face a principal surface of the third electrical insulating sheet at which the at least one cavity has been formed, and disposing second wiring board with a second wiring pattern so as to be opposed to the first wiring board with respect to the third electrical insulating sheet;

stacking the first wiring board, the third electrical insulating sheet and the second wiring board so that the electronic component is built in the cavity and the via hole is disposed between the first wiring pattern and the second wiring pattern; and applying heat and pressure by hot pressing to the stacked first wiring board, third electrical insulating sheet and second wiring board, so that the first wiring pattern and the second wiring pattern are connected electrically through a via conductor made of the conductive resin paste, wherein a first electronic component and at least one second electronic component whose height is taller than that of the first electronic component are mounted so that the first and the at least one second electronic components are placed on the first wiring pattern of the first wiring board, a first cavity and at least one second cavity are formed in the first electrical insulating sheet and at least one third cavity that communicates with the at least one second cavity is formed in the second electrical insulating sheet that covers the first cavity, so that heights of the first cavity and the at least one second cavity combined with the at least one third cavity correspond to the respective heights of the first electronic component and the at least one second electronic component and the first wiring board, the third electrical insulating sheet, and the second wiring board are stacked so that the first electronic component is built in the first cavity and the at least one second electronic component is built in the at least one second cavity combined with the at least one third cavity.

2. The method for manufacturing a component built-in module according to claim 1, wherein the third electrical insulating sheet is formed by further laminating a fourth electrical insulating sheet with a cavity formed penetrating therethrough so as to be opposed to the first electrical insulating sheet with respect to the second electrical insulating sheet, the second wiring board disposed to be opposed to the first wiring board further comprises an electronic component mounted on the second wiring pattern, and the first wiring board, the third electrical insulating sheet and the second wiring board are stacked so that the electronic component mounted on the second wiring pattern is built in the cavity formed in the fourth electrical insulating sheet.

3. The method for manufacturing a component built-in module according to claim 1, wherein the second electrical insulating sheet comprises a cavity penetrating therethrough, the cavity being formed at a position that does not overlap with a position of the cavity formed in the first electrical insulating sheet, the second wiring board disposed to be opposed to the first wiring board further comprises an electronic component mounted on the second wiring pattern, and the first wiring board, the third electrical insulating sheet and the second wiring board are stacked so that the electronic component mounted on the second wiring pattern is built in the cavity formed in the second electrical insulating sheet.

4. The method for manufacturing a component built-in module according to claim 1, wherein the first wiring board further comprises a supporting member with the first wiring pattern formed thereon, and after applying heat and pressure by the hot pressing, the supporting member is removed.

5. The method for manufacturing a component built-in module according to claim 1, wherein the first electrical insulating sheet and the second electrical insulating sheet comprise 70 to 95 weight % of inorganic filler and 5 to 30 weight % of uncured thermosetting resin composition.

6. The method for manufacturing a component built-in module according to claim 1, wherein after attaching a protective film to a principal surface of the third electrical insulating sheet, the via hole is formed so as to penetrate through the protective film and the third electrical insulating sheet.

7. The method for manufacturing a component built-in module according to claim 1, wherein the via hole is filled with the conductive resin paste by the steps of:

(i) disposing the conductive resin paste on a principal surface of the third electrical insulating sheet;

(ii) applying the conductive resin paste over the principal surface so that a paste layer made of the conductive resin paste with a predetermined thickness is formed around an opening of the via hole on the principal surface, while filling the via hole with the conductive resin paste; and (iii) scraping the paste layer off from the principal surface, while filling the via hole with the conductive resin paste.

8. The method for manufacturing a component built-in module according to claim 7, wherein the paste layer is formed on the opening of the via hole and at a region within at least 300 µm from an edge of the opening.

9. The method for manufacturing a component built-in module according to claim 7, wherein the predetermined thickness of the paste layer is 10 µm or more and 100 µm or less.

10. The method for manufacturing a component built-in module according to claim 7, wherein before conducting the step (iii), a part of a resin component of the conductive resin paste charged in the via hole is sucked through an opposite opening of the via hole.

11. The method for manufacturing a component built-in module according to claim 7, wherein the step (iii) is conducted while sucking a part of a resin component of the conductive resin paste charged in the via hole through an opposite opening of the via hole.

12. The method for manufacturing a component built-in module according to claim 7, wherein after conducting the step (ii) plural times, the step (iii) is conducted.

13. The method for manufacturing a component built-in module according to claim 1, wherein after attaching a protective film to a principal surface of the third electrical insulating sheet, the via hole is formed so as to penetrate through the protective film and the third electrical insulating sheet; and the via hole is filled with the conductive resin paste by the steps of: (i) disposing the conductive resin paste on a principal surface of the protective film; (ii) applying the conductive resin paste over the principal surface of the protective film so that a paste layer made of the conductive resin paste with a predetermined thickness is formed around an opening of the via hole on the principal surface of the protective film, while filling the via hole with the conductive resin paste; and (iii) scraping the paste layer off from the principal surface of the protective film, while filling the via hole with the conductive resin paste.

14. The method for manufacturing a component built-in module according to claim 13, wherein the paste layer is formed on the opening of the via hole and at a region within at least 300 μm from an edge of the opening.

15. The method for manufacturing a component built-in module according to claim 13, wherein the predetermined thickness of the paste layer is 10 μm or more and 100 μm or less.

16. The method for manufacturing a component built-in module according to claim 13, wherein before conducting the step (iii), a part of a resin component of the conductive resin paste charged in the via hole is sucked through an opposite opening of the via hole.

17. The method for manufacturing a component built-in module according to claim 13, wherein the step (iii) is conducted while sucking a part of a resin component of the conductive resin paste charged in the via hole through an opposite opening of the via hole.

18. The method for manufacturing a component built-in module according to claim 13, wherein after conducting the step (ii) plural times, the step (iii) is conducted.

19. The method for manufacturing a component built-in module according to claim 1, wherein each of the at least one cavity is formed corresponding to a size of an electronic component to be built in.

20. The method for manufacturing a component built-in module according to claim 1, wherein a capacity of at least one is 80 to 120% of a volume of the electronic component to be built in.

* * * * *